United States Patent
Deng

(10) Patent No.: US 11,995,319 B2
(45) Date of Patent: May 28, 2024

(54) MEMORY DEVICE AND PROGRAM OPERATION THEREOF

(71) Applicant: YANGTZE MEMORY TECHNOLOGIES CO., LTD., Wuhan (CN)

(72) Inventor: Jialiang Deng, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 3 days.

(21) Appl. No.: 17/992,177

(22) Filed: Nov. 22, 2022

(65) Prior Publication Data
US 2024/0143181 A1    May 2, 2024

Related U.S. Application Data

(63) Continuation of application No. PCT/CN2022/128148, filed on Oct. 28, 2022.

(51) Int. Cl.
*G06F 3/06*  (2006.01)
*G06F 12/0802*  (2016.01)

(52) U.S. Cl.
CPC .......... *G06F 3/0613* (2013.01); *G06F 3/0659* (2013.01); *G06F 3/0679* (2013.01); *G06F 12/0802* (2013.01); *G06F 2212/1016* (2013.01)

(58) Field of Classification Search
CPC .... G06F 3/0613; G06F 3/0659; G06F 3/0679; G06F 12/0802; G06F 2212/1016;
(Continued)

(56) References Cited

U.S. PATENT DOCUMENTS

| | | | | | |
|---|---|---|---|---|---|
| 5,748,535 | A | * | 5/1998 | Lin | G11C 16/0491 365/185.11 |
| 7,953,954 | B2 | * | 5/2011 | Ly | G11C 16/10 711/221 |

(Continued)

FOREIGN PATENT DOCUMENTS

CN    113490984 A    10/2021

OTHER PUBLICATIONS

International Search Report issued in corresponding International Application No. PCT/CN2022/128148, dated Apr. 14, 2023, 3 pages.

*Primary Examiner* — William E. Baughman
(74) *Attorney, Agent, or Firm* — BAYES PLLC

(57) ABSTRACT

In certain aspects, a memory device includes an array of memory cells columns and rows, word lines respectively coupled to rows of the memory cells, bit lines respectively coupled to the columns of the memory cells, and a peripheral circuit coupled to the array of memory cells through the bit lines and the word lines and configured to program a select row of the rows of the memory cells based on a current data page. Each memory cell is set to one of $2^N$ levels corresponding a piece of N-bits data, where N is an integer greater than 2. The peripheral circuit includes page buffer circuits respectively coupled to the bit lines. Each page buffer circuit includes one cache storage unit, N−1 data storage units, and a multipurpose storage unit. The cache storage unit is configured to sequentially receive N bits of the current data page and N bits of a next data page, and sequentially store one of the N bits of the current data page and each of the N bits of the next data page. The data storage units each is configured to sequentially store a respective one of the N bits of the current data page and a respective one of the N bits of the next data page. The multipurpose storage unit is
(Continued)

configured to store at least one of the N bits of the current data page.

20 Claims, 17 Drawing Sheets

(58) Field of Classification Search
CPC ..... G11C 16/10; G11C 16/0483; G11C 16/08; G11C 16/24; G11C 16/3459; G11C 11/5628; G11C 11/5671
See application file for complete search history.

(56) References Cited

U.S. PATENT DOCUMENTS

| | | | | |
|---|---|---|---|---|
| 2009/0259800 | A1* | 10/2009 | Kilzer | G06F 12/0246 711/E12.008 |
| 2012/0020155 | A1* | 1/2012 | Kim | G11C 11/5628 365/185.03 |
| 2012/0155180 | A1* | 6/2012 | Kawamura | G11C 16/3413 365/185.17 |
| 2012/0159072 | A1* | 6/2012 | Hida | G06F 12/0862 711/119 |
| 2013/0163335 | A1* | 6/2013 | Kim | G11C 16/3436 365/185.12 |
| 2016/0093384 | A1* | 3/2016 | Lee | G11C 16/24 365/185.12 |
| 2017/0140826 | A1* | 5/2017 | Yano | G11C 16/10 |
| 2020/0135270 | A1* | 4/2020 | Lee | G06F 12/0246 |
| 2020/0327933 | A1 | 10/2020 | El Gamal et al. | |
| 2021/0034301 | A1* | 2/2021 | Zhou | G06F 3/0679 |
| 2022/0310178 | A1 | 9/2022 | Yang et al. | |
| 2022/0392536 | A1* | 12/2022 | Wan | G11C 16/0483 |

* cited by examiner

| TLC | L0 | L1 | L2 | L3 | L4 | L5 | L6 | L7 |
|---|---|---|---|---|---|---|---|---|
| LP / D1 | 1 | 0 | 1 | 0 | 0 | 1 | 1 | 0 |
| MP / D2 | 1 | 0 | 0 | 1 | 0 | 1 | 0 | 1 |
| UP / DC | 1 | 0 | 0 | 0 | 1 | 0 | 1 | 1 |

| QLC | L0 | L1 | L2 | L3 | L4 | L5 | L6 | L7 | L8 | L9 | L10 | L11 | L12 | L13 | L14 | L15 |
|---|---|---|---|---|---|---|---|---|---|---|---|---|---|---|---|---|
| LP / D1 | 1 | 0 | 0 | 0 | 1 | 0 | 1 | 0 | 0 | 1 | 1 | 0 | 1 | 0 | 1 | 1 |
| MP / D2 | 1 | 0 | 0 | 1 | 0 | 0 | 0 | 0 | 1 | 1 | 0 | 1 | 1 | 1 | 1 | 0 |
| UP / D3 | 1 | 0 | 1 | 0 | 0 | 0 | 0 | 1 | 0 | 0 | 1 | 1 | 1 | 1 | 0 | 1 |
| XP / DC | 1 | 0 | 0 | 0 | 0 | 1 | 1 | 1 | 1 | 0 | 0 | 0 | 0 | 1 | 1 | 1 |

FIG. 10A

| TLC | L0 | L1 | L2 | L3 | L4 | L5 | L6 | L7 |
|---|---|---|---|---|---|---|---|---|
| LP / D1 | 1 | 1 | 1 | 1 | 1 | 0 | 1 | 0 |
| MP / D2 | 1 | 1 | 1 | 1 | 1 | 0 | 0 | 1 |
| UP / DC | 1 | 1 | 1 | 1 | 1 | 1 | 1 | 1 |

| QLC | L0 | L1 | L2 | L3 | L4 | L5 | L6 | L7 | L8 | L9 | L10 | L11 | L12 | L13 | L14 | L15 |
|---|---|---|---|---|---|---|---|---|---|---|---|---|---|---|---|---|
| LP / D1 | 1 | 1 | 1 | 1 | 1 | 1 | 1 | 1 | 1 | 1 | 1 | 1 | 0 | 1 | 1 | 1 |
| MP / D2 | 1 | 1 | 1 | 1 | 1 | 1 | 1 | 1 | 1 | 1 | 1 | 1 | 0 | 0 | 1 | 0 |
| UP / D3 | 1 | 1 | 1 | 1 | 1 | 1 | 1 | 1 | 1 | 1 | 1 | 1 | 0 | 0 | 0 | 1 |
| XP / DC | 1 | 1 | 1 | 1 | 1 | 1 | 1 | 1 | 1 | 1 | 1 | 1 | 1 | 1 | 1 | 1 |

L4 PASS

| | L0 | L1 | L2 | L3 | L4 | L5 | L6 | L7 | DL | Cache in |
|---|---|---|---|---|---|---|---|---|---|---|
| LP D1 | 1 | 1 | 1 | 1 | 1 | 1 | 1 | 0 | | |
| MP D2 | 1 | 1 | 1 | 1 | 1 | 1 | 0 | 1 | 3BL/4BL | |
| UP DC | 1 | 1 | 1 | 1 | 1 | 0 | 1 | 1 | | |

L5 Re-DPP

| | L0 | L1 | L2 | L3 | L4 | L5 | L6 | L7 | DL | Cache in |
|---|---|---|---|---|---|---|---|---|---|---|
| LP D1 | 1 | 1 | 1 | 1 | 1 | 0 | 1 | 0 | | |
| MP D2 | 1 | 1 | 1 | 1 | 1 | 0 | 0 | 1 | 3BL/4BL | |
| UP DC | 1 | 1 | 1 | 1 | 1 | 1 | 1 | 1 | | |

Cache in LP

| | L0 | L1 | L2 | L3 | L4 | L5 | L6 | L7 | DL | Cache in |
|---|---|---|---|---|---|---|---|---|---|---|
| LP D1 | 1 | 1 | 1 | 1 | 1 | 0 | 1 | 0 | | |
| MP D2 | 1 | 1 | 1 | 1 | 1 | 0 | 0 | 1 | 3BL/4BL | |
| UP DC | X | X | X | X | X | X | X | X | | Next LP |

LV6

L5 PASS

| | L0 | L1 | L2 | L3 | L4 | L5 | L6 | L7 | DL | Cache in |
|---|---|---|---|---|---|---|---|---|---|---|
| LP D1 | 1 | 1 | 1 | 1 | 1 | 1 | 1 | 0 | | |
| MP D2 | 1 | 1 | 1 | 1 | 1 | 1 | 0 | 1 | 3BL/4BL | |
| UP DC | X | X | X | X | X | X | X | X | | Next LP |

L7→DL

| | L0 | L1 | L2 | L3 | L4 | L5 | L6 | L7 | DL | Cache in |
|---|---|---|---|---|---|---|---|---|---|---|
| LP D1 | 1 | 1 | 1 | 1 | 1 | 1 | 1 | 1 | L7 | |
| MP D2 | 1 | 1 | 1 | 1 | 1 | 1 | 0 | X | | |
| UP DC | X | X | X | X | X | X | X | X | | Next LP |

Cache in MP

| | L0 | L1 | L2 | L3 | L4 | L5 | L6 | L7 | DL | Cache in |
|---|---|---|---|---|---|---|---|---|---|---|
| LP D1 | X | X | X | X | X | X | X | X | | Next LP |
| MP D2 | 1 | 1 | 1 | 1 | 1 | 1 | 0 | X | L7 | |
| UP DC | X | X | X | X | X | X | X | X | | Next MP |

LV7

L6 PASS

| | L0 | L1 | L2 | L3 | L4 | L5 | L6 | L7 | DL | Cache in |
|---|---|---|---|---|---|---|---|---|---|---|
| LP D1 | X | X | X | X | X | X | X | X | | Next LP |
| MP D2 | 1 | 1 | 1 | 1 | 1 | 1 | 1 | X | L7 | |
| UP DC | X | X | X | X | X | X | X | X | | Next MP |

Cache in UP

| | L0 | L1 | L2 | L3 | L4 | L5 | L6 | L7 | DL | Cache in |
|---|---|---|---|---|---|---|---|---|---|---|
| LP D1 | X | X | X | X | X | X | X | X | | Next LP |
| MP D2 | X | X | X | X | X | X | X | X | L7 | Next MP |
| UP DC | X | X | X | X | X | X | X | X | | Next UP |

| L4 PASS | L0 | L1 | L2 | L3 | L4 | L5 | L6 | L7 | DS | Cache in |
|---|---|---|---|---|---|---|---|---|---|---|
| LP D1 | 1 | 1 | 1 | 1 | 1 | 1 | 1 | 0 | inh | |
| MP D2 | 1 | 1 | 1 | 1 | 1 | 1 | 0 | 1 | | |
| UP DC | 1 | 1 | 1 | 1 | 1 | 0 | 1 | 1 | | |

| L5 Re-DPP | L0 | L1 | L2 | L3 | L4 | L5 | L6 | L7 | DS | Cache in |
|---|---|---|---|---|---|---|---|---|---|---|
| LP D1 | 1 | 1 | 1 | 1 | 1 | 0 | 1 | 0 | inh | |
| MP D2 | 1 | 1 | 1 | 1 | 1 | 0 | 0 | 1 | | |
| UP DC | 1 | 1 | 1 | 1 | 1 | 1 | 1 | 1 | | |

| Cache in LP | L0 | L1 | L2 | L3 | L4 | L5 | L6 | L7 | DS | Cache in |
|---|---|---|---|---|---|---|---|---|---|---|
| LP D1 | 1 | 1 | 1 | 1 | 1 | 0 | 1 | 0 | inh | |
| MP D2 | 1 | 1 | 1 | 1 | 1 | 0 | 0 | 1 | | |
| UP DC | X | X | X | X | X | X | X | X | | Next LP |

| L5 PASS | L0 | L1 | L2 | L3 | L4 | L5 | L6 | L7 | DS | Cache in |
|---|---|---|---|---|---|---|---|---|---|---|
| LP D1 | 1 | 1 | 1 | 1 | 1 | 1 | 1 | 0 | inh | |
| MP D2 | 1 | 1 | 1 | 1 | 1 | 0 | 0 | 1 | | |
| UP DC | X | X | X | X | X | X | X | X | | Next LP |

| Cache in MP | L0 | L1 | L2 | L3 | L4 | L5 | L6 | L7 | DS | Cache in |
|---|---|---|---|---|---|---|---|---|---|---|
| LP D1 | X | X | X | X | X | X | X | X | L7 | Next LP |
| MP D2 | 1 | 1 | 1 | 1 | 1 | 1 | 0 | 1 | | |
| UP DC | X | X | X | X | X | X | X | X | | Next MP |

| L6 PASS | L0 | L1 | L2 | L3 | L4 | L5 | L6 | L7 | DS | Cache in |
|---|---|---|---|---|---|---|---|---|---|---|
| LP D1 | X | X | X | X | X | X | X | X | L7 | Next LP |
| MP D2 | 1 | 1 | 1 | 1 | 1 | 1 | 1 | 1 | | |
| UP DC | X | X | X | X | X | X | X | X | | Next MP |

| Cache in UP | L0 | L1 | L2 | L3 | L4 | L5 | L6 | L7 | DS | Cache in |
|---|---|---|---|---|---|---|---|---|---|---|
| LP D1 | X | X | X | X | X | X | X | X | L7 | Next LP |
| MP D2 | X | X | X | X | X | X | X | X | | Next MP |
| UP DC | X | X | X | X | X | X | X | X | | Next UP |

L11 PASS

|  | L0 | L1 | L2 | L3 | L4 | L5 | L6 | L7 | L8 | L9 | L10 | L11 | L12 | L13 | L14 | L15 | DS | Cache in |
|---|---|---|---|---|---|---|---|---|---|---|---|---|---|---|---|---|---|---|
| LP | 1 | 1 | 1 | 1 | 1 | 1 | 1 | 1 | 1 | 1 | 1 | 1 | 1 | 1 | 1 | 1 | Inh |  |
| MP (D1) | 1 | 1 | 1 | 1 | 1 | 1 | 1 | 1 | 1 | 1 | 1 | 1 | 1 | 0 | 1 | 1 |  |  |
| UP (D2) | 1 | 1 | 1 | 1 | 1 | 1 | 1 | 1 | 1 | 1 | 1 | 1 | 1 | 1 | 0 | 0 |  |  |
| XP (D3) | 1 | 1 | 1 | 1 | 1 | 1 | 1 | 1 | 1 | 1 | 1 | 1 | 0 | 1 | 1 | 1 |  |  |
| DC |  |  |  |  |  |  |  |  |  |  |  |  |  |  |  |  |  |  |

L12 Re-DPP

|  | L0 | L1 | L2 | L3 | L4 | L5 | L6 | L7 | L8 | L9 | L10 | L11 | L12 | L13 | L14 | L15 | DS | Cache in |
|---|---|---|---|---|---|---|---|---|---|---|---|---|---|---|---|---|---|---|
| LP | 1 | 1 | 1 | 1 | 1 | 1 | 1 | 1 | 1 | 1 | 1 | 1 | 1 | 1 | 1 | 1 | Inh |  |
| MP (D1) | 1 | 1 | 1 | 1 | 1 | 1 | 1 | 1 | 1 | 1 | 1 | 1 | 0 | 1 | 1 | 1 |  |  |
| UP (D2) | 1 | 1 | 1 | 1 | 1 | 1 | 1 | 1 | 1 | 1 | 1 | 1 | 0 | 0 | 0 | 0 |  |  |
| XP (D3) | 1 | 1 | 1 | 1 | 1 | 1 | 1 | 1 | 1 | 1 | 1 | 1 | 0 | 0 | 0 | 1 |  |  |
| DC |  |  |  |  |  |  |  |  |  |  |  |  |  |  |  |  |  |  |

Cache in LP

|  | L0 | L1 | L2 | L3 | L4 | L5 | L6 | L7 | L8 | L9 | L10 | L11 | L12 | L13 | L14 | L15 | DS | Cache in |
|---|---|---|---|---|---|---|---|---|---|---|---|---|---|---|---|---|---|---|
| LP | 1 | 1 | 1 | 1 | 1 | 1 | 1 | 1 | 1 | 1 | 1 | 1 | 1 | 1 | 1 | 1 | Inh |  |
| MP (D1) | 1 | 1 | 1 | 1 | 1 | 1 | 1 | 1 | 1 | 1 | 1 | 1 | 0 | 0 | 1 | 1 |  |  |
| UP (D2) | 1 | 1 | 1 | 1 | 1 | 1 | 1 | 1 | 1 | 1 | 1 | 1 | 0 | 0 | 0 | 0 |  |  |
| XP (D3) | X | X | X | X | X | X | X | X | X | X | X | 1 | X | X | X | X |  | Next LP |
| DC |  |  |  |  |  |  |  |  |  |  |  |  |  |  |  |  |  |  |

LV13

L12 PASS

|  | L0 | L1 | L2 | L3 | L4 | L5 | L6 | L7 | L8 | L9 | L10 | L11 | L12 | L13 | L14 | L15 | DS | Cache in |
|---|---|---|---|---|---|---|---|---|---|---|---|---|---|---|---|---|---|---|
| LP | 1 | 1 | 1 | 1 | 1 | 1 | 1 | 1 | 1 | 1 | 1 | 1 | 1 | 1 | 1 | 1 | Inh |  |
| MP (D1) | 1 | 1 | 1 | 1 | 1 | 1 | 1 | 1 | 1 | 1 | 1 | 1 | 0 | 0 | 1 | 1 |  |  |
| UP (D2) | 1 | 1 | 1 | 1 | 1 | 1 | 1 | 1 | 1 | 1 | 1 | 1 | 1 | 0 | 0 | X |  |  |
| XP (D3) | X | X | X | X | X | X | X | X | X | X | X | X | X | X | X | X |  | Next LP |
| DC |  |  |  |  |  |  |  |  |  |  |  |  |  |  |  |  |  |  |

Cache in MP

|  | L0 | L1 | L2 | L3 | L4 | L5 | L6 | L7 | L8 | L9 | L10 | L11 | L12 | L13 | L14 | L15 | DS | Cache in |
|---|---|---|---|---|---|---|---|---|---|---|---|---|---|---|---|---|---|---|
| LP | 1 | 1 | 1 | 1 | 1 | 1 | 1 | 1 | 1 | 1 | 1 | 1 | 1 | X | X | X | Inh |  |
| MP (D1) | 1 | 1 | 1 | 1 | 1 | 1 | 1 | 1 | 1 | 1 | 1 | 1 | 1 | 0 | 1 | 0 |  | Next LP |
| UP (D2) | 1 | 1 | 1 | 1 | 1 | 1 | 1 | 1 | 1 | 1 | 1 | 1 | 0 | 0 | 0 | 1 |  |  |
| XP (D3) | X | X | X | X | X | X | X | X | X | X | X | X | X | X | X | X |  | Next MP |
| DC |  |  |  |  |  |  |  |  |  |  |  |  |  |  |  |  |  |  |

FIG. 14B

L13 PASS

| | | L0 | L1 | L2 | L3 | L4 | L5 | L6 | L7 | L8 | L9 | L10 | L11 | L12 | L13 | L14 | L15 | DS | Cache in |
|---|---|---|---|---|---|---|---|---|---|---|---|---|---|---|---|---|---|---|---|
| LP | D1 | X | X | X | X | X | X | X | X | X | X | X | X | X | X | X | X | inh | Next LP |
| MP | D2 | 1 | 1 | 1 | 1 | 1 | 1 | 1 | 1 | 1 | 1 | 1 | 1 | 1 | 1 | 1 | 0 | | |
| UP | D3 | 1 | 1 | 1 | 1 | 1 | 1 | 1 | 1 | 1 | 1 | 1 | 1 | 1 | 1 | 0 | 1 | | |
| XP | DC | X | X | X | X | X | X | X | X | X | X | X | X | X | X | X | X | | Next MP |

↓ LV14

Cache in UP

| | | L0 | L1 | L2 | L3 | L4 | L5 | L6 | L7 | L8 | L9 | L10 | L11 | L12 | L13 | L14 | L15 | DS | Cache in |
|---|---|---|---|---|---|---|---|---|---|---|---|---|---|---|---|---|---|---|---|
| LP | D1 | X | X | X | X | X | X | X | X | X | X | X | X | X | X | X | X | L15 | Next LP |
| MP | D2 | 1 | 1 | 1 | 1 | 1 | 1 | 1 | 1 | 1 | 1 | 1 | 1 | 1 | 1 | 1 | 0 | | Next MP |
| UP | D3 | 1 | 1 | 1 | 1 | 1 | 1 | 1 | 1 | 1 | 1 | 1 | 1 | 1 | 1 | 0 | 1 | | |
| XP | DC | X | X | X | X | X | X | X | X | X | X | X | X | X | X | X | X | | |

L14 PASS

| | | L0 | L1 | L2 | L3 | L4 | L5 | L6 | L7 | L8 | L9 | L10 | L11 | L12 | L13 | L14 | L15 | DS | Cache in |
|---|---|---|---|---|---|---|---|---|---|---|---|---|---|---|---|---|---|---|---|
| LP | D1 | X | X | X | X | X | X | X | X | X | X | X | X | X | X | X | X | L15 | Next LP |
| MP | D2 | X | X | X | X | X | X | X | X | X | X | X | X | X | X | X | X | | Next MP |
| UP | D3 | 1 | 1 | 1 | 1 | 1 | 1 | 1 | 1 | 1 | 1 | 1 | 1 | 1 | 1 | 1 | 1 | | Next UP |
| XP | DC | X | X | X | X | X | X | X | X | X | X | X | X | X | X | X | X | | |

↓ LV15

Cache in XP

| | | L0 | L1 | L2 | L3 | L4 | L5 | L6 | L7 | L8 | L9 | L10 | L11 | L12 | L13 | L14 | L15 | DS | Cache in |
|---|---|---|---|---|---|---|---|---|---|---|---|---|---|---|---|---|---|---|---|
| LP | D1 | X | X | X | X | X | X | X | X | X | X | X | X | X | X | X | X | L15 | Next LP |
| MP | D2 | X | X | X | X | X | X | X | X | X | X | X | X | X | X | X | X | | Next MP |
| UP | D3 | X | X | X | X | X | X | X | X | X | X | X | X | X | X | X | X | | Next UP |
| XP | DC | X | X | X | X | X | X | X | X | X | X | X | X | X | X | X | X | | Next XP |

MEMORY DEVICE AND PROGRAM OPERATION THEREOF

CROSS-REFERENCE TO RELATED APPLICATIONS

This application is a continuation of International Application No. PCT/CN2022/128148, filed on Oct. 28, 2022, entitled "MEMORY DEVICE AND PROGRAM OPERATION THEREOF," which is hereby incorporated by reference in its entirety.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase. For NAND Flash memory, an erase operation can be performed at the block level, and a program operation or a read operation can be performed at the page level.

SUMMARY

In one aspect, a memory device includes an array of memory cells columns and rows, word lines respectively coupled to rows of the memory cells, bit lines respectively coupled to the columns of the memory cells, and a peripheral circuit coupled to the array of memory cells through the bit lines and the word lines and configured to program a select row of the rows of the memory cells based on a current data page. Each memory cell is set to one of $2^N$ levels corresponding to a piece of N-bits data, where N is an integer greater than 2. The peripheral circuit includes page buffer circuits respectively coupled to the bit lines. Each page buffer circuit includes one cache storage unit, N−1 data storage units, and a multipurpose storage unit. The cache storage unit is configured to, in programming the select row based on the current data page, sequentially receive N bits of the current data page and N bits of a next data page, and sequentially store one of the N bits of the current data page and each of the N bits of the next data page. The data storage units each is configured to, in programming the select row based on the current data page, sequentially store a respective one of the N bits of the current data page and a respective one of the N bits of the next data page. The multipurpose storage unit is configured to, in programming the select row based on the current data page, store at least one of the N bits of the current data page.

In some implementations, the multipurpose storage unit is configured to, in programming the select row based on the current data page, sequentially store first information indicative of a voltage level applied to the respective bit line, and the 3rd to last bit of the N bits of the current data page.

In some implementations, the multipurpose storage unit is configured to, in programming the select row based on the current data page, sequentially store second information indicative of whether a respective memory cell of the select row is inhibited in programming, and the 2nd to last bit and the 3rd to last bit of the N bits of the current data page.

In some implementations, the page buffer circuit further includes a data pre-processing unit coupled to the cache storage unit and configured to convert N bits of a raw data page to the N bits of the current data page based on a Gray code. In some implementations, a first number of bits corresponding to "0" at one level in the Gray code is not smaller than a second number of bits corresponding to "0" at an adjacent higher level in the Gray code.

In some implementations, at the 2nd to last level of the $2^N$ levels in the Gray code, only the 2nd to last bit of the N bits corresponds to "0".

In some implementations, to program the select row based on the current data page, the peripheral circuit is configured to sequentially verify the select row at $2^N-1$ levels of the $2^N$ levels.

In some implementations, the cache storage unit is configured to store the last bit of the N bits of the current data page before verifying the select row at the (N+1)th to last level of the $2^N$ levels, and sequentially store each of the N bits of the next data page after verifying the select row at a respective one of the last N+1 levels to of the $2^N$ levels.

In some implementations, the multipurpose storage unit is configured to store non-data page information before verifying the select row at the 3rd to last level of the $2^N$ levels, and store the at least one of the N bits of the current data page after verifying the select row at the 3rd to last level of the $2^N$ levels.

In some implementations, the (N−1)th data storage unit of the data storage units is configured to store the 2nd to last bit the N bits of the current data page before verifying the select row at the 2nd to last level of the $2^N$ levels, and store the 2nd to last bit of the N bits of the next data page after verifying the select row at the 2nd to last level of the $2^N$ levels.

In some implementations, the peripheral circuit further includes a word line driver coupled to the word lines and configured to apply a program voltage on a select word line of the word lines coupled to the select row, and sequentially apply $2^N-1$ verify voltages on the select word line, the $2^N-1$ verify voltages corresponding to the $2^N-1$ levels of the $2^N$ levels.

In some implementations, the peripheral circuit is further configured to program a next select row of the rows of memory cells based on the next data page after programming the select row based on the current data page.

In some implementations, each of the cache storage unit, the multipurpose storage unit, and the data storage units includes a latch.

In another aspect, a system includes a memory device configured to store data and a memory controller coupled to the memory device and configured to control the memory device. The memory device includes an array of memory cells columns and rows, word lines respectively coupled to rows of the memory cells, bit lines respectively coupled to the columns of the memory cells, and a peripheral circuit coupled to the array of memory cells through the bit lines and the word lines and configured to program a select row of the rows of the memory cells based on a current data page. Each memory cell is set to one of $2^N$ levels corresponding to a piece of N-bits data, where N is an integer greater than 2. The peripheral circuit includes page buffer circuits respectively coupled to the bit lines. Each page buffer circuit includes one cache storage unit, N−1 data storage units, and a multipurpose storage unit. The cache storage unit is configured to, in programming the select row based on the current data page, sequentially receive N bits of the current data page and N bits of a next data page, and sequentially store one of the N bits of the current data page and each of the N bits of the next data page. The data storage units each is configured to, in programming the select row based on the current data page, sequentially store a respective one of the N bits of the current data page and a respective one of the N bits of the next data page. The multipurpose storage unit is configured to, in programming the select row based on the current data page, store at least one of the N bits of the current data page.

In still another aspect, a method for programming a memory device is provided. The memory device includes rows of memory cells. N bits of a current data page are obtained, where N is an integer greater than 2. One of the N bits of the current data page is stored in one cache storage unit, and a respective one of the N bits of the current data page is stored in each of N−1 data storage units. Non-data page information is stored in a multipurpose storage unit. A select row of the rows of memory cells is sequentially verified at $2^N-1$ levels of $2^N$ levels. At least one of the N bits of the current data page is stored in the multipurpose storage unit after verifying at the 3rd to last level of the $2^N$ levels. N bits of a next data page are obtained after verifying the select row at the (N+1)th to last level of $2^N$ levels. Each of the N bits of the next data page is sequentially stored in the cache storage unit after verifying at a respective one of the last N+1 levels of the $2^N$ levels.

In some implementations, to obtain the N bits of the current data page, N bits of a raw data page are received, and the N bits of the raw data page are converted to the N bits of the current data page based on a Gray code. In some implementations, a first number of bits corresponding to "0" at one level in the Gray code is not smaller than a second number of bits corresponding to "0" at an adjacent higher level in the Gray code.

In some implementations, at the 2nd to last level of the $2^N$ levels in the Gray code, only the 2nd to last bit of the N bits corresponds to "0".

In some implementations, the Gray code is updated after verifying the select row at the (N+1)th to last level of $2^N$ levels such that, at the Nth to last level of the $2^N$ levels in the Gray code, only the last bit of the N bits corresponds to "1".

In some implementations, each of the first bit to 2nd to last bit of the N bits of the next data page is sequentially stored in the respective data storage unit after verifying the select row at a respective one of the last N levels of the $2^N$ levels.

In some implementations, the non-data page information includes first information indicative of a voltage level applied to a respective memory cell of the select row. In some implementations, to store the at least one of the N bits of the current data page in the multipurpose storage unit, the 3rd to last bit of the N bits of the current data page is stored in the multipurpose storage unit after verifying the select row at the 3rd to last level of the $2^N$ levels.

In some implementations, the non-data page information includes second information indicative of whether a respective memory cell of the select row is inhibited in programming. In some implementations, to store the at least one of the N bits of the current data page in the multipurpose storage unit, the 2nd to last bit and the 3rd to last bit of the N bits of the current data page are stored in the multipurpose storage unit after verifying the select row at the 3rd to last level of the $2^N$ levels.

In some implementations, to store one of the N bits of the current data page in the one cache storage unit, the last bit of the N bits of the current data page is stored in the cache storage unit before verifying the select row at the (N+1)th to last level of the $2^N$ levels.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIGS. 10A and 10B illustrate Gray codes for program operations applied to trip-level cells (TLCs) and quad-level cells (QLCs), according to some aspects of the present disclosure.

FIG. 11 illustrates a scheme of multi-cache data loading in a program operation applied to TLCs, according to some aspects of the present disclosure.

FIG. 12 illustrates another scheme of multi-cache data loading in a program operation applied to TLCs, according to some aspects of the present disclosure.

FIGS. 13A and 13B illustrate a scheme of multi-cache data loading in a program operation applied to QLCs, according to some aspects of the present disclosure.

FIGS. 14A and 14B illustrate another scheme of multi-cache data loading in a program operation applied to QLCs, according to some aspects of the present disclosure.

Figure 1:
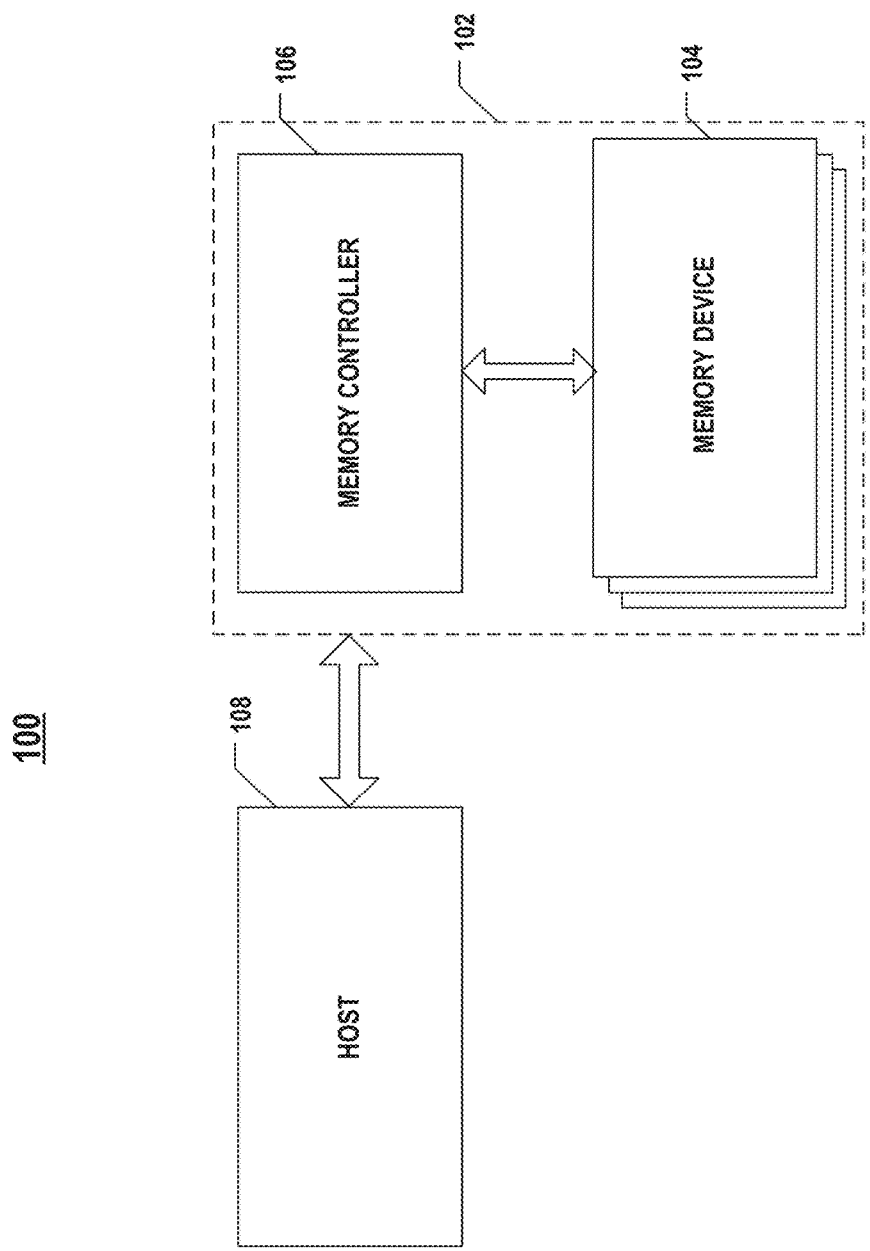
FIG. 1 illustrates a block diagram of a system having a memory device, according to some aspects of the present disclosure.

The present disclosure will be described with reference to the accompanying drawings.

DETAILED DESCRIPTION

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Memory devices, such as NAND Flash memory devices, can store more than a single bit of information into each memory cell in multiple levels (a.k.a., states) in order to increase the storage capacity and reduce the cost per bit. In program operations, the data may be programmed (written) into xLCs, such as multi-level cells (MLCs), trip-level cells (TLCs), quad-level cells (QLCs), etc. For some memory devices having xLCs, a cache program command can be used to allow data insertion for one data page while programming of another data page is currently under execution. To shrink the peripheral circuit size, memory devices usually include only one cache latch for each bit line (BL), which allows only one bit of data (e.g., known as the lower page "LP") from the next data page to be inserted while programming using the current data page. Other bits of data (e.g., the middle page "MP" and upper page "UP" for TLCs, and extra page "XP" for QLCs) in the next data page need to be inserted after the completion of the current data page program execution. In other words, not all data from the next data page can be hidden behind the current data page program operation. As a result, additional windows between programming adjacent data pages are needed to load portions of the next data page, which affects the performance of sequential program operations, e.g., increasing the program speed (tPROG).

Although the data loading windows can be reduced or even avoided by some multi-cache data loading (a.k.a., multi-page cache in) schemes that utilize not only the cache latch, but also some data latches, to cache more bits of data from the next data page, those schemes still require at least the same number of data latches as the number of data bits in each xLC (e.g., three data latches for TLCs and four data latches for QLCs) as well as a dedicated cache latch. As the total number of data latches and cache latches increases proportionally as the number of bit lines increases, the size of the page buffer having the latches becomes a major burden in shrinking the memory device size as the memory cell density increases.

To address one or more of the aforementioned issues, the present disclosure introduces a solution that reuses some latches in the page buffer for multi-cache data loading in program operations. As a result, the number of latches needed for each bit line can be further reduced, for example, to 5 latches for TLCs or 6 latches for QLCs, while fully avoiding the data loading windows for sequential program operations. To avoid the data loading windows, other latch (es) in the page buffer, for example, a latch for storing the bit line voltage level information or a latch for storing cell inhibition information in program operations, can be reused to store part of the current data page at a certain stage during the program operation. Also, the cache latch can be used not only for caching the next data page, but also for storing part of the current data page, thereby replacing one of the dedicated data latches. Moreover, each data latch can be used not only for storing a respective part of the current data page, but also for caching a respective part of the next data page. Thus, sequential program performance of cache programming can be improved (e.g., with a fast program speed) without any circuit size cost.

FIG. 1 illustrates a block diagram of a system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104.

Memory device 104 can be any memory device disclosed in the present disclosure. As disclosed below in detail, memory device 104, such as a NAND Flash memory device, can perform a program operation applied to TLCs, QLCs, etc. (i.e., memory cell set to one of $2^N$ levels corresponding to a piece of N-bits data, where N is an integer greater than 2) based on a data page having N bits of data for each memory cell. Consistent with the scope of the present disclosure, multi-cache data loading schemes can be achieved with a page buffer (e.g., having a 5-latch configuration or TLCs or a 6-latch configuration for QLCs) of memory device 104 having one cache storage unit (e.g., one cache latch) configured to sequentially store one bit of the current data page and each bit of the next data page, N−1 data storage units (e.g., 2 data latches for TLCs and 3 data latches for QLCs) each configured to sequentially store a respective bit of the current data page and a respective bit of the next data page, as well as a multipurpose storage unit (e.g., a 3/4 bit line (BL) latch or a program/sensing latch) configured to sequentially store non-data page information and at least one bit of the current data page.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
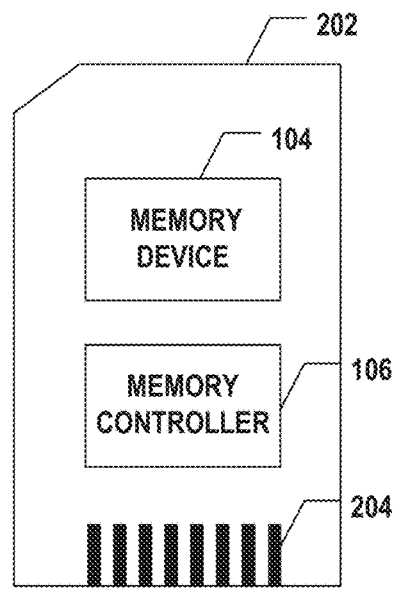
FIG. 2A illustrates a diagram of a memory card having a memory device, according to some aspects of the present disclosure.
Figure 2B:
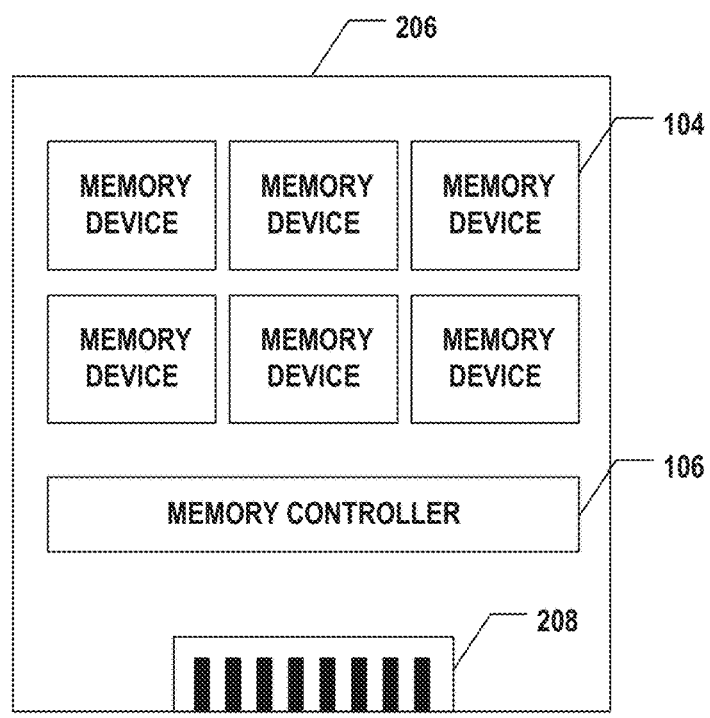
FIG. 2B illustrates a diagram of a solid-state drive (SSD) having a memory device, according to some aspects of the present disclosure.

Memory controller 106 and one or more memory devices 104 can be integrated into various types of storage devices, for example, being included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202.

Figure 3:
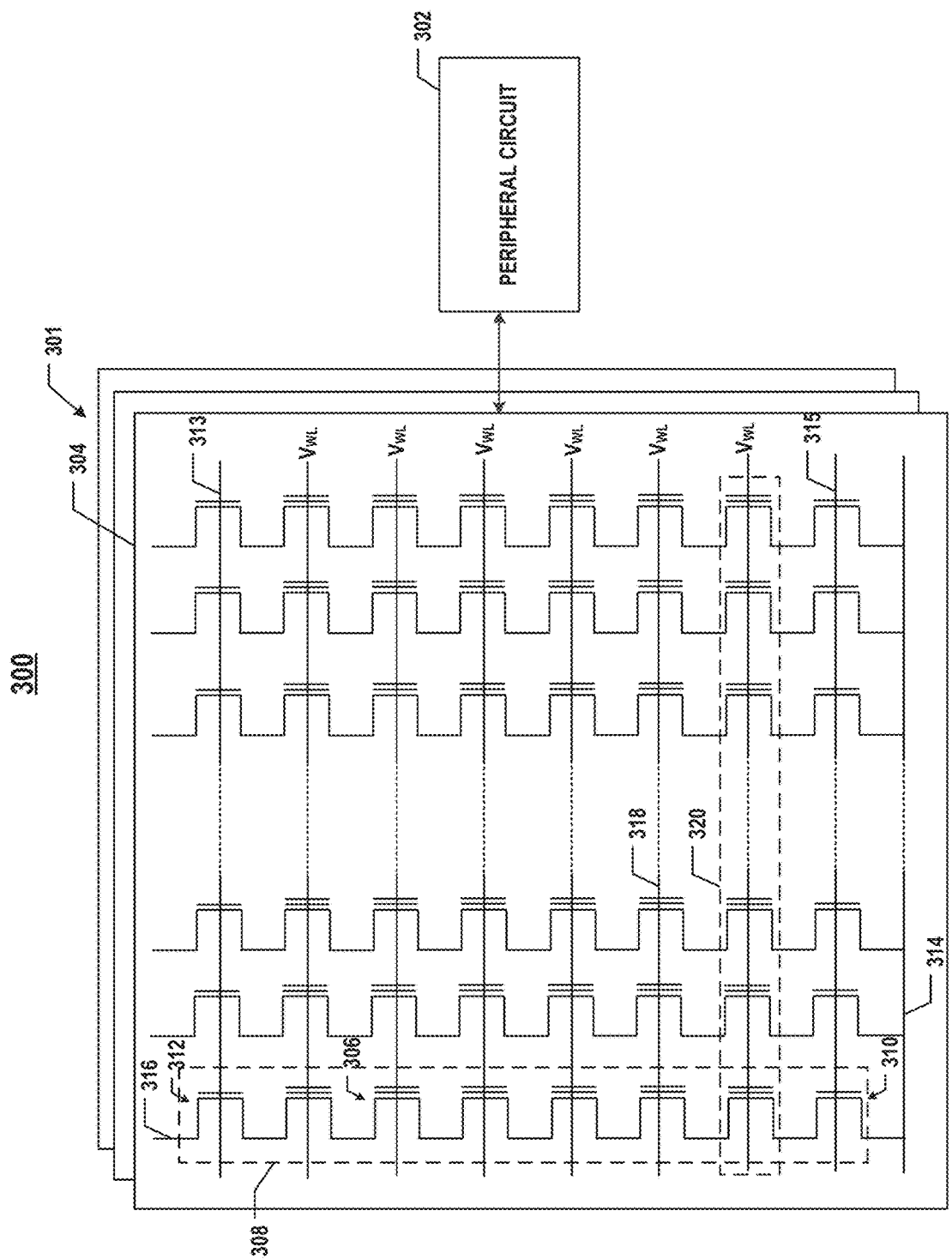
FIG. 3 illustrates a schematic diagram of a memory device including peripheral circuits, according to some aspects of the present disclosure.

FIG. 3 illustrates a schematic circuit diagram of a memory device 300 including peripheral circuits, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, which depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single level cell (SLC) that has two possible memory states (levels) and thus, can store one bit of data. For example, the first memory state "0" can correspond to a first range of threshold voltages, and the second memory state "1" can correspond to a second range of threshold voltages. In some implementations, each memory cell 306 is an xLC that is capable of storing more than a single bit of data in more than four memory states (levels). For example, the xLC may store two bits per cell (MLC), three bits per cell (TLC), or four bits per cell (QLC)). Each xLC can be programmed to assume a range of possible nominal storage values (i.e., corresponding to $2^N$ pieces of N-bits data). In one example, the MLC can be programmed to assume one of three possible programming levels from an erased state by writing one of three possible nominal storage values to the cell. A fourth nominal storage value can be used for the erased state.

As shown in FIG. 3, each NAND memory string 308 can also include a source select gate (SSG) transistor 310 at its source end and a drain select gate (DSG) transistor 312 at its drain end. SSG transistor 310 and DSG transistor 312 can be configured to activate select NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (ACS), according to some implementations. The drain of each NAND memory string 308 is coupled to a respective bit line 316 from which data can be read or written via an output bus (not shown), according to some implementations. In some implementations, each NAND memory string 308 is configured to be selected or deselected by applying a select voltage or a deselect voltage to the gate of respective DSG transistor 312 through one or more DSG lines 313 and/or by applying a select voltage or a deselect voltage to the gate of respective SSG transistor 310 through one or more SSG lines 315.

As shown in FIG. 3, NAND memory strings 308 can be organized into multiple blocks 304, each of which can have a common source line 314, e.g., coupled to the ACS. In some implementations, each block 304 is the basic data unit for erase operations, i.e., all memory cells 306 on the same block 304 are erased at the same time. To erase memory cells 306 in a select block 304, source lines 314 coupled to select block 304 as well as unselect blocks 304 in the same plane as select block 304 can be biased with an erase voltage (Vers), such as a high positive bias voltage (e.g., 20 V or more). Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for read and program operations. The size of one in one block 304. Each word line 318 can include a plurality of control gates (gate electrodes) at each memory cell 306 in respective page 320 and a gate line coupling the control gates.

As shown in FIG. 3, memory cell array 301 can include an array of memory cells 306 in a plurality of rows and a plurality of columns in each block 304. One row of memory cells 306 corresponds to one or more pages 320, and one column of memory cells corresponds to one NAND memory string 308, according to some implementations. The plurality of rows of memory cells 306 can be respectively coupled to word lines 318, and the plurality of columns of memory cells 306 can be respectively coupled to bit lines 316. Peripheral circuit 302 can be coupled to memory cell array 301 through bit lines 316 and word lines 318.

Figure 4:
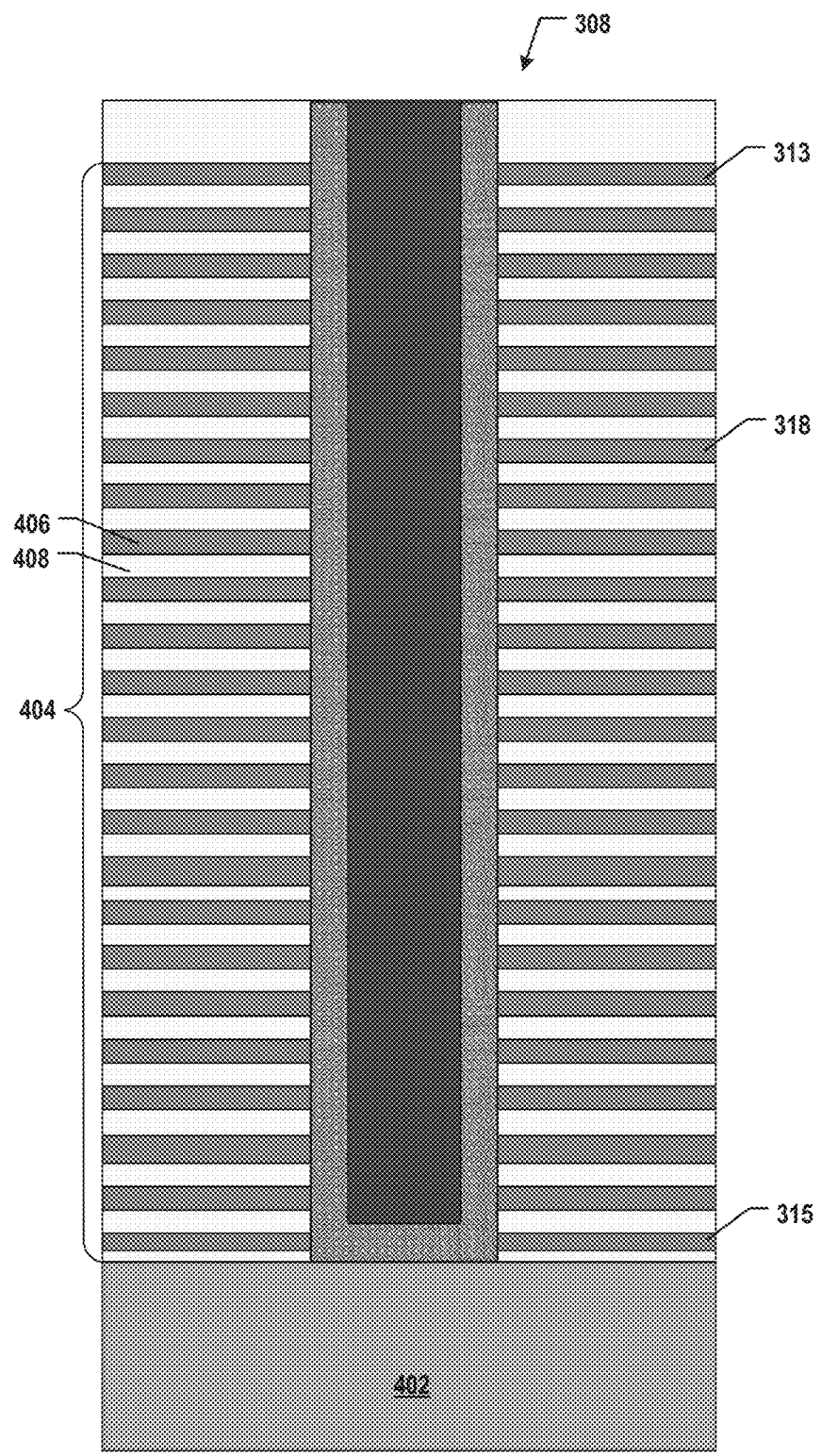
FIG. 4 illustrates a side view of a cross-section of a memory cell array including a NAND memory string, according to some aspects of the present disclosure.

FIG. 4 illustrates a side view of a cross-section of memory cell array 301 including NAND memory string 308, according to some aspects of the present disclosure. As shown in FIG. 4, NAND memory string 308 can extend vertically through a memory stack 404 above a substrate 402. Substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 404 can include interleaved gate conductive layers 406 and gate-to-gate dielectric layers 408. The number of the pairs of gate conductive layers 406 and gate-to-gate dielectric layers 408 in memory stack 404 can determine the number of memory cells 306 in memory cell array 301. Gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include control gates surrounding memory cells 306, the gates of DSG transistors 312, or the gates of SSG transistors 310, and can extend laterally as DSG line 313 at the top of memory stack 404, SSG line 315 at the bottom of memory stack 404, or word line 318 between DSG line 313 and SSG line 315.

As shown in FIG. 4, NAND memory string 308 includes a channel structure extending vertically through memory stack 404. In some implementations, the channel structure includes a channel hole filled with semiconductor material(s) (e.g., as a semiconductor channel) and dielectric material(s) (e.g., as a memory film). It is understood that although not shown in FIG. 4, additional components of memory cell array 301 can be formed including, but not limited to, gate line slits/source contacts, local contacts, interconnect layers, etc.

Figure 5:
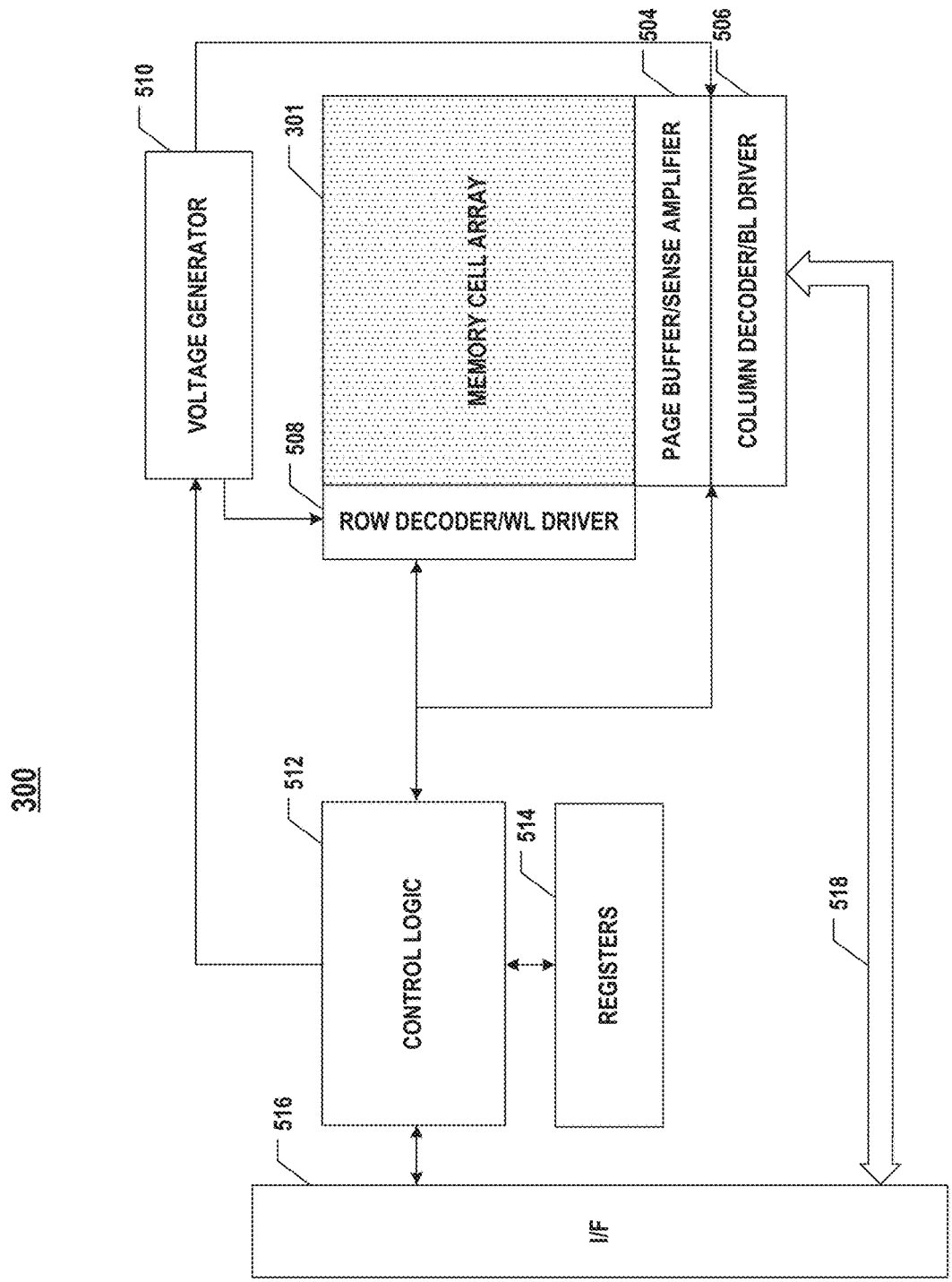
FIG. 5 illustrates a block diagram of a memory device including a memory cell array and peripheral circuits, according to some aspects of the present disclosure.

Referring back to FIG. 3, peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each select memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 5 illustrates some exemplary peripheral circuits including a page buffer/sense amplifier 504, a column decoder/bit line driver 506, a row decoder/word line driver 508, a voltage generator 510, control logic 512, registers 514, an interface (I/F) 516, and a data bus 518. It is understood that in some examples, additional peripheral circuits not shown in FIG. 5 may be included as well.

Page buffer/sense amplifier 504 can be configured to sense (read) and program (write) data from and to memory cell array 301 according to the control signals from control logic 512. In one example, page buffer/sense amplifier 504 may store one page of program data (write data, referred to herein as "data page") to be programmed into one page 320 of memory cell array 301. In another example, page buffer/sense amplifier 504 may verify programmed select memory cells 306 in each program/verify loop (cycle) in a program operation to ensure that the data has been properly programmed into memory cells 306 coupled to select word lines 318. In still another example, page buffer/sense amplifier 504 may also sense the low power signals from bit line 316 that represents a data bit stored in memory cell 306 and amplify the small voltage swing to recognizable logic levels in a read operation. As described below in detail and consistent with the scope of the present disclosure, in program operations, page buffer/sense amplifier 504 can include a plurality of page buffer circuits respectively coupled to bit lines 316, and each including a set of storage units (e.g., latches) for temporarily storing a piece of N-bits data received from data bus 518 (converted from a piece of N-bits raw data based on a Gray code) and providing the piece of N-bits data to a corresponding select memory cell 306 through the corresponding bit line 316 in a program operation using a multi-cache loading scheme.

Column decoder/bit line driver 506 can be configured to be controlled by control logic 512 and select one or more NAND memory strings 308 by applying bit line voltages generated from voltage generator 510. Row decoder/word line driver 508 can be configured to be controlled by control logic 512 and select/deselect blocks 304 of memory cell array 301 and select/deselect word lines 318 of block 304. Row decoder/word line driver 508 can be further configured to drive word lines 318 using word line voltages generated from voltage generator 510. In some implementations, row decoder/word line driver 508 can also select/deselect and drive SSG lines 315 and DSG lines 313 as well. Voltage generator 510 can be configured to be controlled by control logic 512 and generate the word line voltages (e.g., read voltage, program voltage, channel pass voltage, local voltage, verify voltage, etc.), bit line voltages, and source line voltages to be supplied to memory cell array 301.

Control logic 512 can be coupled to each peripheral circuit described above and configured to control the operations of each peripheral circuit. Registers 514 can be coupled to control logic 512 and include status registers, command registers, and address registers for storing status information, command operation codes (OP codes), and command addresses for controlling the operations of each peripheral circuit. Interface 516 can be coupled to control logic 512 and act as a control buffer to buffer and relay control commands received from a memory controller (e.g., 106 in FIG. 1) and/or a host (e.g., 108 in FIG. 1) to control logic 512 and status information received from control logic 512 to the memory controller and/or the host. Interface 516 can also be coupled to column decoder/bit line driver 506 via data bus 518 and act as a data input/output (I/O) interface and a data buffer to buffer and relay the data to and from memory cell array 301.

Figure 6:
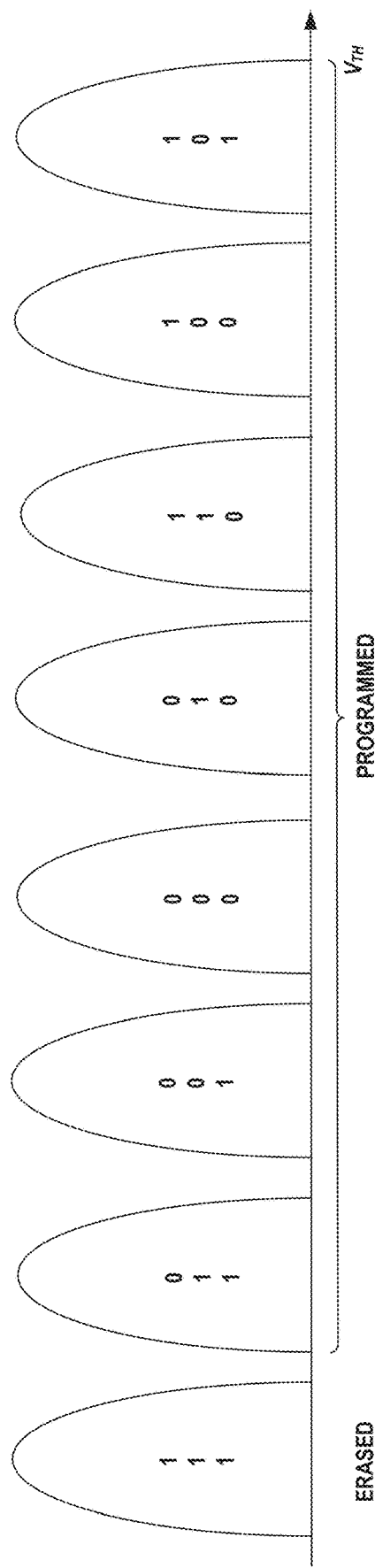
FIG. 6 illustrates threshold voltage distributions of memory cells in a program operation, according to some aspects of the present disclosure.

FIG. 6 illustrates exemplary threshold voltage distributions of memory cells in a program operation, according to some aspects of the present disclosure. As described above, each memory cell 306 can be set to one of $2^N$ levels corresponding to a piece of N-bits data, where N is an integer greater than 1 (e.g., N=2 for MLCs, N=3 for TLCs, N=4 for QLCs, etc.). Each level can correspond to one of $2^N$ threshold voltage (Vth) ranges of memory cells 306. Taking TLCs, where N=3, for example, as shown in FIG. 6, memory cell 306 may be programmed into one of the 8 levels, including one level of the erased state and 7 levels of the programmed states. Each level may correspond to a respective threshold voltage (Vth) range of memory cells 306. For example, the level corresponding to the lowest threshold voltage range (the left-most threshold voltage distribution in FIG. 6) may be considered as level 0, the level corresponding to the second-lowest threshold voltage range (the second left-most threshold voltage distribution in FIG. 6) may be considered as level 1, and so until level 7 corresponding to the highest threshold voltage range (the right-most threshold voltage distribution in FIG. 6).

On the other hand, each level can correspond to one of the $2^N$ pieces of N-bits data that is to be stored in select memory cell 306. In some implementations, the $2^N$ pieces of N-bits data may be mapped to the $2^N$ levels based on a Gray code. A Gray code (a.k.a., reflected binary code (RBC) or reflected binary (RB)) is an ordering of the binary numeral system such that two successive values differ in only one bit (binary digit). For example, TABLE I below shows an example of a binary code representing a one-to-one mapping between 8 levels (L0 to L7) and 8 pieces of 3-bits data used in the example of FIG. 6. As shown in TABLE I, each piece of 3-bits data may consist of three bits of binary values (b1, b2, and b3). In one example, level 1 (L1) may correspond to a piece of 3-bits data having a value of 011. In another example, level 7 (L7) may correspond to another piece of 3-bits data having a value of 101.

TABLE I

|    | L0 | L1 | L2 | L3 | L4 | L5 | L6 | L7 |
|----|----|----|----|----|----|----|----|----|
| b1 | 1  | 0  | 0  | 0  | 0  | 1  | 1  | 1  |
| b2 | 1  | 1  | 0  | 0  | 1  | 1  | 0  | 0  |
| b3 | 1  | 1  | 1  | 0  | 0  | 0  | 0  | 1  |

Also referring to FIG. 5, in a program operation, a data page having N pages (a.k.a. portions) of the N-bits data can be used to program a select row of memory cells 306 coupled to select word line 318. In other words, peripheral circuits 302 can be configured to program a select row of memory cells 306 based on a current data page, which has N pages of the N-bits data. In some implementations, raw data (a.k.a. user data) is transmitted through data bus 518 to page buffer/sense amplifier 504, and page buffer/sense amplifier 504 is configured to convert the raw data into each data page to be programmed into a respective row of memory cells 306 based on a preset Gray code (e.g., shown in TABLE I). Based on the preset Gray code, which defines the mapping of each programmed level and a respective piece of N-bits data (a.k.a., bit-labeling), control logic 512 is configured to send control signals (e.g., enable signals) to page buffer/sense amplifier 504 to allow page buffer/sense amplifier 504 to generate sequential data pages for sequential program operations, according to some implementations. Depending on the number N (e.g., whether memory cell 306 is MLC, TLC, QLC, etc.), each data page can include N pages (a.k.a. portions) that can be separately loaded into page buffer/sense amplifier 504 and moved around within page buffer/sense amplifier 504 as described below in detail. During the ongoing program operation, the current data page can be temporarily stored in page buffer/sense amplifier 504, and page buffer/sense amplifier 504 can be configured to provide to each memory cell 306 coupled to select word line 318 the corresponding piece of N-bits data through the corresponding bit line 316.

Figure 7:
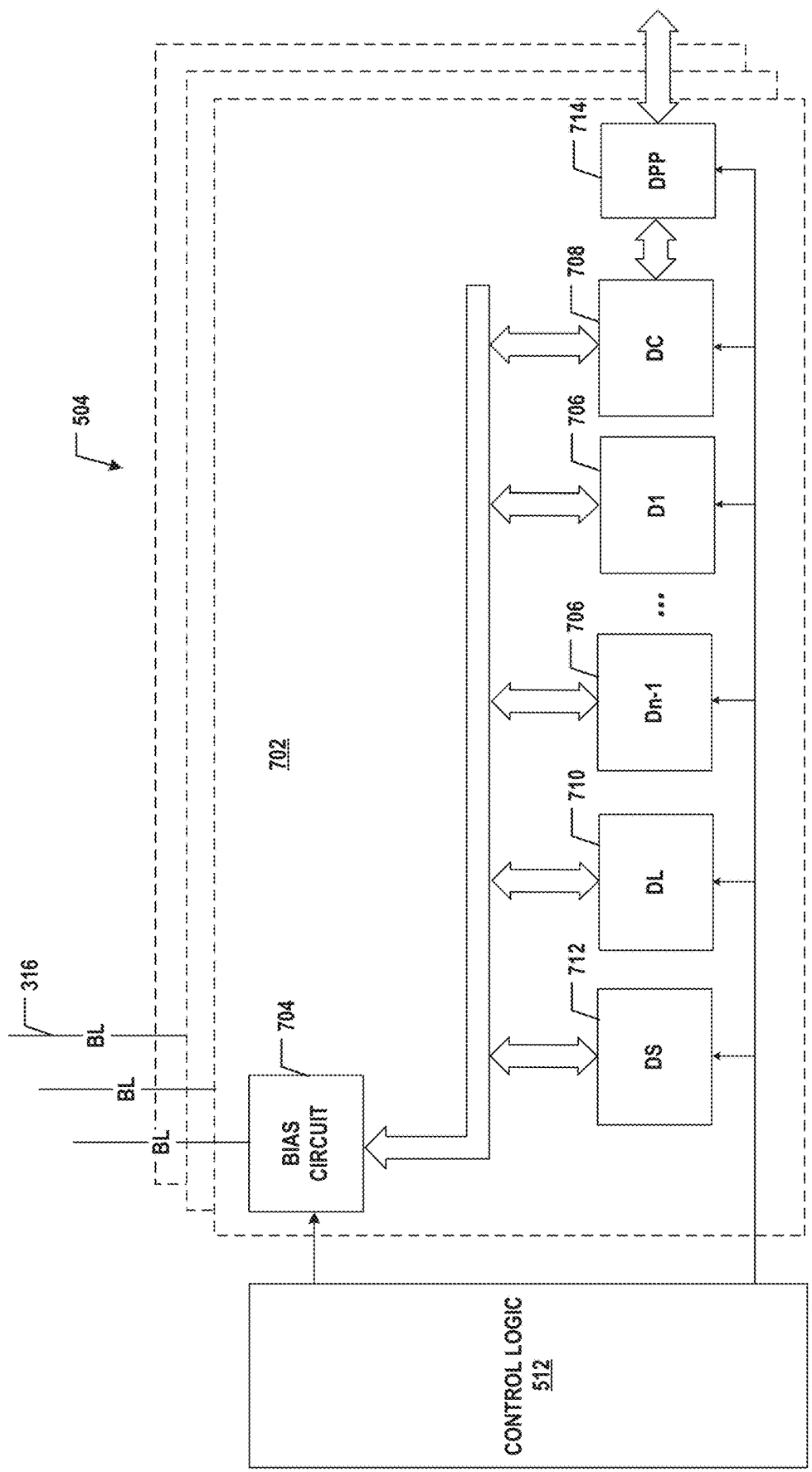
FIG. 7 illustrates a detailed block diagram of a page buffer in a program operation, according to some aspects of the present disclosure.

For example, FIG. 7 illustrates a detailed block diagram of page buffer/sense amplifier 504 in a program operation, according to some aspects of the present disclosure. In some implementations, page buffer/sense amplifier 504 includes a plurality of page buffer circuits 702 each coupled to a respective one of bit lines 316. In other words, each page buffer circuit 702 can be coupled to a respective column of memory cells 306 (e.g., NAND memory string 308) through a corresponding bit line 316 and configured to temporarily store the piece of N-bits data (i.e., the N bits of the current data page) that is used for programming a respective select memory cell 306 (coupled to select word line 318 and the corresponding bit line 316) in a program operation. All page buffer circuits 702 together can temporarily store the N pages of the entire current data page that are used for programming the select row of memory cells 306 (e.g., a page 320 of memory cells 306) coupled to select word line 318 in the program operation. For example, for TLCs where N=3, each page buffer circuit 702 may be configured to temporarily store a respective one of the 8 sets of 3 bits of the current data page, which correspond to 8 levels, respectively.

As shown in FIG. 7, page buffer circuit 702 can include a data pre-processing (DPP) unit 714 configured to receive a respective portion of the raw data (e.g., N bits of the raw data page) from data bus 518 and convert it to the corresponding N bits of the current data page based on a preset Gray code (e.g., the example shown in TABLE 1 and other examples disclosed herein). As described below in detail, in some implementations, DPP unit 714 is further configured to update the Gray code during a program operation, for example, after verifying the select row of memory cells 306 at a certain level. In other words, DPP unit 714 can enable page buffer circuit 702 to achieve dynamic data pro-processing (re-DPP) at the programming stage by updating the preset Gray code and converting the raw data page to the current data page again based on the updated Gray code.

In sequential program operations, to reduce or even avoid the data loading windows between adjacent data pages used for programming different rows of memory cells 306, each page buffer circuit 702 can be further configured to cache part or the entirety of the piece of N-bits data (i.e., the N bits of the next data page) that is used for programming a next select memory cell 306 in the next program operation while programming the current select memory cell 306 in the ongoing program operation. All page buffer circuits 702 together can follow a multi-cache data loading scheme to cache one or more of the N pages of the entire next data page that are used for programming the next select row of memory cells 306 (e.g., the next page 320 of memory cells 306) coupled to the next select word line 318 in the current program operation.

Figure 8:
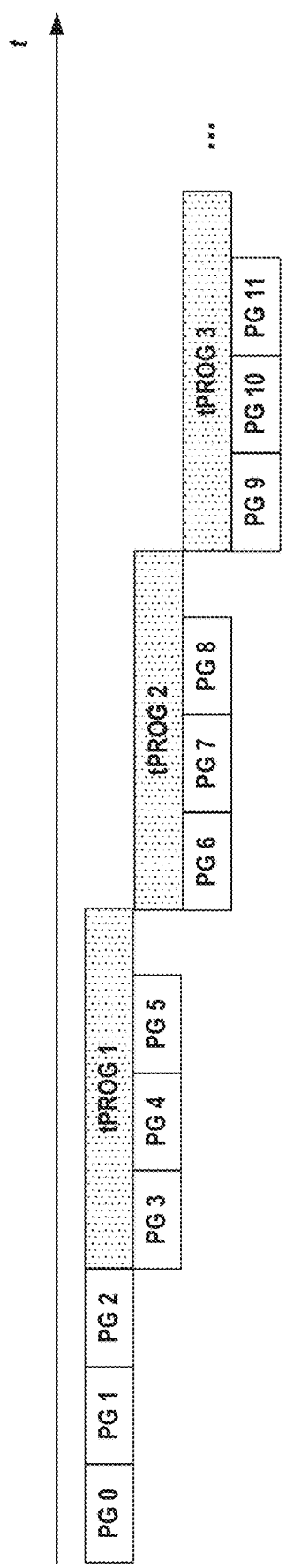
FIG. 8 illustrates a timing diagram of multi-cache data loading in a program operation, according to some aspects of the present disclosure.

For example, FIG. 8 illustrates a timing diagram of multi-cache data loading in a program operation, according to some aspects of the present disclosure. As shown in FIG. 8, still taking TLCs where N=3 as an example, the 3 pages (PG 0, PG 1, and PG 2) of the $1^{st}$ data page may be loaded and stored in page buffer/sense amplifier 504 and used for programming the $1^{st}$ row of memory cells 306. During the time period of programming the $1^{st}$ row of memory cells 306 (tPROG 1), the 3 pages (PG 3, PG 4, and PG 5) of the $2^{nd}$ data page may be loaded and cached in page buffer/sense amplifier 504 as well. In other words, the $2^{nd}$ data page may be ready before the end of tPROG 1, such that the programming of the $2^{nd}$ row of memory cells 306 may start immediately after the programming of the $1^{st}$ row of memory cells 306 without any window for loading the $2^{nd}$ data page. Similarly, during the time period of programming the $2^{nd}$ row of memory cells 306 (tPROG 2), the 3 pages (PG 6, PG 7, and PG 8) of the $3^{rd}$ data page may be loaded and cached in page buffer/sense amplifier 504 as well. As a result, the performance of sequential program operations can be improved by the multi-cache data loading scheme.

Referring back to FIG. 7, to implement the multi-cache data loading scheme for sequential program operations, each page buffer circuit 702 can include a set of data storage units 706 and a cache storage unit (DC) 708. During the current ongoing program operation for programming a select row of memory cells 306 based on a current data page (e.g., converted from a raw data page by DPP unit 714), each data storage unit 706 can be configured to store a respective one of the N bits of the current data page, and cache storage unit 708 can be configured to sequentially store each of the N bits of the next data page (i.e., cache the N bits of the next data page). To reduce the number of storage units and the size of page buffer circuit 702, the number of cache storage unit 708 is limited to one, i.e., a single cache storage unit 708 that can store only a single bit of data at the same time, according to some implementations. Thus, the single cache storage unit 708 is configured to sequentially store each of the N bits of the next data page at different time periods during the current program operation, as described below in detail. Moreover, each data storage unit 706 can be configured to store a respective one of the N bits of the next data page as well during the current program operation when the respective stored bit of the current data page is no longer needed, i.e., performing the cache function as well, due to the limited number (e.g., one) of cache storage unit 708. For example, each data storage unit 706 may be configured to sequentially store the respective one of the N bits of the current data page and a respective one of the N bits of the next data page.

Existing multi-cache data loading schemes require the number of data storage units in each page buffer circuit 702 to be at least the same as the number of bits in the piece of data used for programming the corresponding select memory cell 306, i.e., N data storage units, because the single cache storage unit is dedicated to caching the data of the next data page. Different from the existing schemes and consistent with the scope of the present disclosure, the single cache storage unit 708 in page buffer circuit 702 in FIG. 7 can also be configured to store one of the N bits of the current data page. That is, cache storage unit 708 is configured to sequentially store one of the N bits of the current data page and each of the N bits of the next data page, according to some implementations. In other words, cache storage unit 708 can act as both a data storage unit and a cache storage unit in a time-division manner to replace one of data storage units 706 in each page buffer circuit 702. In some implementations, as shown in FIG. 7, the number of data storage units 706 in each page buffer circuit 702 thus becomes N−1 (D1 to Dn−1, e.g., 2 for TLCs and 3 for QLCs). The total number of data storage units 706 and cache storage unit 708 thus can be reduced from N+1 to N, compared with the existing multi-cache data loading schemes.

It is understood that a total of N data storage units 706 and cache storage unit 708 may reduce the data loading window by caching N−1 bits of the N bits of the next data page in programming the current select row of memory cells based on the current data page, but may not be able to completely avoid the data loading window (i.e., hide all data input behind array operation). Thus, consistent with the scope of the present disclosure, in some implementations, another storage unit in each page buffer circuit 702 for storing non-data page information is configured to sequentially store the non-data page information and at least one of the N bits of the current data page, thereby enabling the caching of all N bits of the next data page in the current program operation to avoid the data loading windows. That is, page buffer circuit 702 can include a multipurpose storage unit that can store the non-data page information and the data of the current data page in a time-division manner.

Each page buffer circuit 702 can include a plurality of storage units for storing non-data page information, i.e., any information other than the data bits in a data page. As shown in FIG. 7, in some implementations, page buffer circuit 702 includes a sensing/program storage unit 712 (DS) configured to store information indicative of whether corresponding select memory cell 306 coupled to a respective bit line 316 is inhibited in programming during a program operation. The information can indicate whether corresponding select memory cell 306 has passed the verification at a particular level (thus being inhibited in programming) or failed to pass the verification at the level (verify fail). For example, sensing/program storage unit 712 may store the result of verify fail count (VFC) at each level. It is understood that sensing/program storage unit 712 may be configured to store other types of non-data page information during a different operation, e.g., read operations. In some implementations, sensing/program storage unit 712 is the multipurpose storage unit that acts as both a sensing/program storage unit and a data storage unit in a time-division manner. As shown in FIG. 7, in some implementations, page buffer circuit 702 also includes a 3BL/4BL storage unit 710 (DL) configured to store the bias information of the respective bit line 316 coupled to page buffer circuit 702, i.e., information indicative of the voltage level applied to corresponding select memory cell 306 coupled to a respective bit line 316. For example, the bias voltage applied to bit line 316 (i.e., bit line voltage) at a particular level may be selected from multiple possible bias voltages (e.g., 3 or 4 bias conditions) as indicated by the bias information stored in 3BL/4BL storage unit 710. In some implementations, 3BL/4BL storage unit 710 is the multipurpose storage unit that acts as both a 3BL/4BL storage unit and a data storage unit in a time-division manner.

As shown in FIG. 7, each page buffer circuit 702 can further include a bias circuit 704 coupled to a respective bit line 316 and configured to apply a bit line voltage to corresponding select memory cell 306 coupled to a respective bit line 316 in the program operation. Depending on whether the corresponding select memory cell 306 passes the verification at the respective level according to the N-bits of data for programming the select memory cell 306, for example, a high voltage level and a low voltage level, can be used as the bit line voltage to bias the respective bit line 316. In some implementations, to optimize the threshold voltage distributions (e.g., shown in FIG. 6), for example, enlarging the read margins between adjacent levels and reducing the width of each level, one or more medium voltage levels are used as well for biasing the bit line voltage. That is, three voltage levels, e.g., high, medium, and low, or four voltage levels, e.g., high, medium high, medium low, and low, can be applied to the respective bit line 316 (referred to herein as 3BL or 4BL). In some implementations, a voltage level applied to the respective bit line 316 (e.g., 3BL bias or 4BL bias) is the non-data page information stored in 3BL/4BL storage unit 710.

It is understood that although sensing/program storage unit 712 and 3BL/4BL storage unit 710 are described herein as examples of the multipurpose storage unit for implementing the multi-cache data loading scheme disclosed in the present disclosure, any suitable non-data page storage units in page buffer circuit 702 not shown in FIG. 7 may be used as the multipurpose storage unit in some examples without adding additional storage units into page buffer circuit 702. It is also understood that each storage unit in page buffer circuit 702, including each data storage unit 706, cache storage unit 708, 3BL/4BL storage unit 710, and sensing/program storage unit 712, may be any circuit that has two stable states for storing a single bit of data, such as a latch or a flip-flop. In one example, each of data storage units 706, cache storage unit 708, 3BL/4BL storage unit 710, and sensing/program storage unit 712 may include a latch. In some implementations, page buffer circuit 702 has a 5-latch configuration that includes one cache latch, two data latches, one 3BL/4BL latch, and one sensing/program latch for TLCs. For example, cache storage unit 708 may include the one cache latch, data storage units 706 may include the two data latches, and the multipurpose storage unit may include the one 3BL/4BL latch or sensing/program latch. In some implementations, page buffer circuit 702 has a 6-latch configuration that includes one cache latch, three data latches, one 3BL/4BL latch, and one sensing/program latch for QLCs. For example, cache storage unit 708 may include the one cache latch, data storage units 706 may include the three data latches, and the multipurpose storage unit may include the one 3BL/4BL latch or sensing/program latch.

In some implementations, the various storage units 706, 708, 710, and 712 in page buffer circuit 702 are coupled to one another following a particular sequence. As a result, the N-bits of data in a data page flow through the various storage units 706, 708, 710, and 712 in page buffer circuit 702 following the corresponding order, according to some implementations. In some implementations, cache storage unit 708 is coupled to DPP unit 714 directly, as shown in FIG. 7, serving as the interface of storage units 706, 708, 710, and 712 for receiving converted data from DPP unit 714, e.g., the N bits of the current data page and the N bits of the next data page in a program operation. In other words, each bit of data may have to go through cache storage unit 708 before it can be moved to and stored in another corresponding storage unit.

Figure 9A:
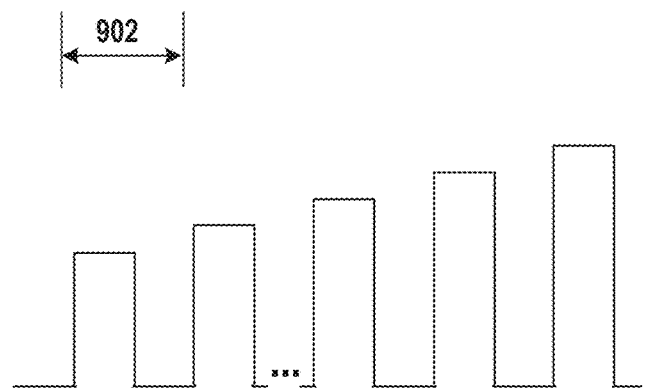
FIGS. 9A and 9B illustrate a waveform of word line voltages applied to a select word line in a program operation, according to some aspects of the present disclosure.
Figure 9B:
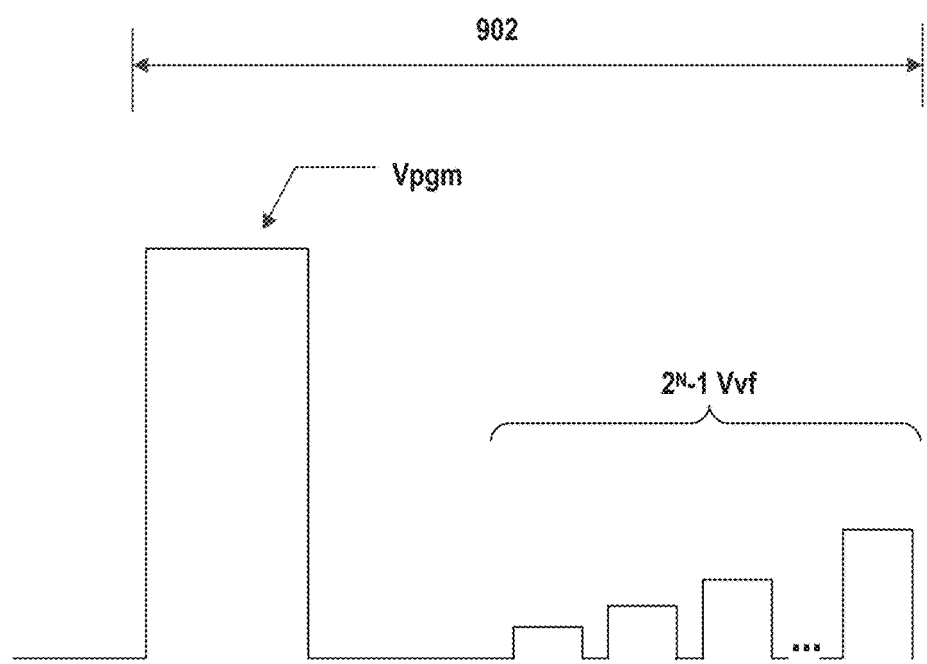

To perform a program operation, in addition to page buffer/sense amplifier 504 providing to each select memory cell 306 the corresponding piece of N-bits data, row decoder/word line driver 508 can be configured to apply program voltages and verify voltages to a select word line 318 coupled to a select row of memory cells 306 in one or more program/verify loops in order to raise the threshold voltage of each select memory cell 306 to a desired level (into a desired range of threshold voltages) based on the corresponding piece of N-bits data. For example, FIGS. 9A and 9B illustrate a waveform of word line voltages applied to a select word line in a program operation. As shown in FIG. 9A, the program operation includes one or more program/verify loops (cycles) 902. As shown in FIG. 9B, in each program/verify loop 902, row decoder/word line driver 508 can be configured to apply a program voltage (Vpgm) on select word line 318 and sequentially apply $2^N-1$ verify voltages (Vvf) with incremental changes of voltage levels. The $2^N-1$ verify voltages can correspond to $2^N-1$ levels of the $2^N$ levels (e.g., the $2^N-1$ programmed levels except for one erased level). That is, peripheral circuit 302 can be configured to sequentially verify the select row of memory cells 306 at the $2^N-1$ levels of the $2^N$ levels. Each select memory cell 306 can be programmed into one of the $2^N$ levels based on the corresponding N bits of data to be stored in select memory cell 306, i.e., the N bits of the current data page stored in the corresponding page buffer circuit 702. Still taking TLCs where N=3 as an example, select memory cells 306 may be sequentially programmed into one of 8 levels (e.g., shown in FIG. 6) by applying 7 verify voltages each corresponding to one of the 7 programmed levels.

Figure 15:
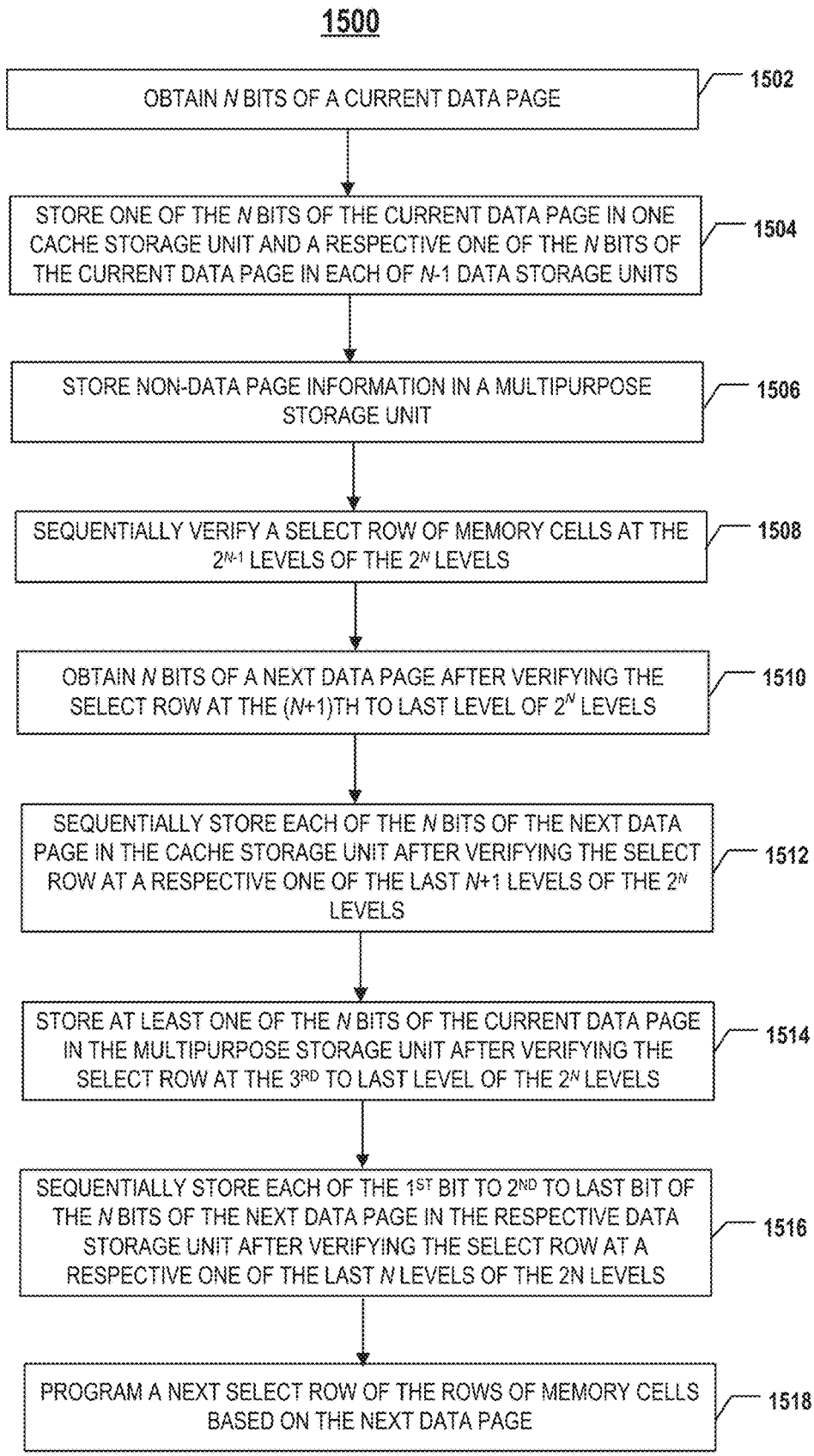
FIG. 15 illustrates a flowchart of a method for programming a memory device, according to some aspects of the present disclosure.

Multi-cache data loading schemes implemented based on memory devices disclosed herein (e.g., memory device 300 including page buffer circuits 702) are described below in detail. For example, FIG. 15 illustrates a flowchart of a method 1500 for programming a memory device, according to some aspects of the present disclosure. The memory device may be any suitable memory device disclosed herein, such as memory device 300. Method 1500 may be implemented by peripheral circuit 302, such as row decoder/word line driver 508 and page buffer/sense amplifier 504. It is understood that the operations shown in method 1500 may not be exhaustive and that other operations can be performed as well before, after, or between any of the illustrated operations. Further, some of the operations may be performed simultaneously, or in a different order than shown in FIG. 15.

Referring to FIG. 15, method 1500 starts at operation 1502, in which N bits of a current data page are obtained in programming a select row of memory cells. In some implementations, to obtain the N bits of the current data page, N bits of a raw data page are received, and the N bits of the raw data page are converted to the N bits of the current data page based on a Gray code. In some implementations, the first number of bits corresponding to "0" at one level in the Gray code is not smaller than the second number of bits corresponding to "0" at an adjacent higher level in the Gray code.

For example, as shown in FIG. 7, control logic 512 may send control signals to DPP unit 714 of each page buffer circuit 702 to control DPP unit 714 to sequentially receive raw data pages each having N bits of data in sequential program operations, and convert each raw data page to a respective current data page having N bits of data based on a Gray code. Control logic 512 may then send control signals to cache storage unit 708 of each page buffer circuit 702 to control cache storage unit 708 to sequentially obtain the converted data pages each having N bits of data in sequential program operations from DPP unit 714. In the current program operation, i.e., programming a select row of memory cells 306 coupled to a select word line 318 based on a current data page, cache storage unit 708 may be configured to sequentially obtain N bits of the current data page and N bits of the next data page immediately following the current data page.

FIGS. 10A and 10B illustrate Gray codes for program operations applied to TLCs and QLCs, according to some aspects of the present disclosure. Each row of the Gray code may represent a respective bit of a data page stored in a respective storage unit. In one example, in the TLC Gray code in FIGS. 10A and 10B, the 1st bit (lower page, "LP"), the 2nd bit (middle page, "MP"), and the 3rd bit (upper page, "UP") of the 3 bits of a data page correspond to the 1st data storage unit (D1), the 2nd data storage unit (D2), and the cache storage unit (DC). In another example, in the QLC Gray code in FIGS. 10A and 10B, the 1st bit (lower page, "LP"), the 2nd bit (middle page, "MP"), the 3rd bit (upper page, "UP"), and the 4th bit (extra page, "XP") of the 4 bits of a data page correspond to the 1st data storage unit (D1), the 2nd data storage unit (D2), the 3rd data storage unit (D3), and the cache storage unit (DC). In some implementations, "0" in the Gray codes indicates an inhibited status, and "1" in the Gray codes indicates a programming status.

The Gray codes shown in FIG. 10A may be examples of original Gray codes used by DPP unit 714 to convert a raw data page to a current data page. The first number of bits corresponding to "0" at one level in the Gray code is not smaller than the second number of bits corresponding to "0" at an adjacent higher level in the Gray code, according to some implementations. For example, in FIG. 10A, except for level 0 (L0, erased state), the number of bits corresponding to "0" may be larger than or equal to the number of bits corresponding to "0" in an adjacent higher level. In one example, in the TLC Gray code in FIG. 10A, level 1 (L1) may have three "0" bits, levels 2-4 (L2-L4) may each have two "0" bits, and levels 5-7 (L5-L7) may each have one "0" bit. Similarly, in another example, in the QLC Gray code in FIG. 10A, level 1 (L1) may have four "0" bits, levels 2-5 (L2-L5) may each have three "0" bits, levels 6-11 (L6-L11) may each have two "0" bits, and levels 12-15 (L12-L15) may each have one "0" bit. The patterns of the original Gray codes described above, e.g., having more "0" in lower levels, may simplify the program operation as it is more convenient to process "0" than "1" in the Gray codes according to some programming schemes.

In some implementations, at the 2nd to last level of the $2^N$ levels in the Gray code, only the 2nd to last bit of the N bits corresponds to "0". In one example, in the TLC Gray code in FIG. 10A, at L6 (the 2nd to last level), the values of the 3 bits may be "101" where only MP (the 2nd to last bit) corresponds to "0". Similarly, in another example, in the QLC Gray code in FIG. 10A, at L14 (the 2nd to last level), the values of the 4 bits may be "1101" where only UP (the 2nd to last bit) corresponds to "0". Due to the specific patterns of the original Gray codes at the 2nd to last level, the data storage unit 706 storing the 3rd to last bit of the N bits of the current data page can be released after verifying select row of memory cells 306 at the 3rd to last level, as described below in detail. In one example, in the TLC Gray code in FIG. 10A, after verifying at L5 (the 3rd to last level), D1 (storing LP) may be released, and D2 (corresponding to "0") may be used to indicate memory cells 306 to be programmed at L6. Similarly, in another example, in the QLC Gray code in FIG. 10A, after verifying at L13 (the 3rd to last level), D2 (storing MP) may be released, and D3 (corresponding to "0") may be used to indicate memory cells 306 to be programmed at L14.

In some implementations, the Gray code is updated after verifying the select row at the (N+1)th to last level of $2^N$ levels such that, at the Nth to last level of the $2^N$ levels in the Gray code, only the last bit of the N bits corresponds to "1". The dynamic updating of Gray code in a program operation is also known as "re-DPP." For example, as shown in FIG. 7, control logic 512 may send control signals to DPP unit 714 of each page buffer circuit 702 to control DPP unit 714 to update the Gray code after verifying select row of memory cells 306 at the N+1)th to last level of $2^N$ levels and convert the raw data page to the current data page based on the updated Gray code after verifying at the N+1)th to last level, i.e., re-DPP based on an updated Gray code. For example, FIG. 10B illustrates examples of the updated Gray codes for TLCs and QLCs corresponding to the original Gray codes in FIG. 10A after updating.

In one example, in the updated TLC (N=3) Gray code in FIG. 10B, after verifying select row of memory cells 306 at L4 (the 4th to last level), all the values of bits at and before L4 (L0-L4) may be updated to "1" to indicate the inhibited status of select row of memory cells 306. At L5 (the 3rd to last level), the values of the 3 bits may be updated from "110" (shown in FIG. 10A) to "001" where only UP (the last bit) corresponds "1" by the re-DPP process. Similarly, in another example, in the updated QLC (N=4) Gray code in FIG. 10B, after verifying select row of memory cells 306 at L11 (the 5th to last level), all the values of bits at and before L11 (L0-L11) may be updated to "1" to indicate the inhibited status of select row of memory cells 306. At L12 (the 4th to last level), the values of the 4 bits may be updated from "1110" (shown in FIG. 10A) to "0001" where only XP (the last bit) corresponds "1" by the re-DPP process. In the example of updated QLC Gray code, at L13, the values of the 4 bits may be updated as well, from "0111" (shown in FIG. 10A) to "1001" to accommodate the change at L12.

Due to the specific patterns of the updated Gray codes at the Nth to last level, cache storage unit 708 storing the last bit of the N bits of the current data page can be released after verifying select row of memory cells 306 at the (N+1)th to last level, as described below in detail. In one example, in the updated TLC Gray code in FIG. 10B, after verifying at L4 (the 4th to last level), DC (storing UP) may be released since UPs at the remaining levels (L5-L7) are all "1," and D1 and D2 (corresponding to "0") may be used to indicate memory cells 306 to be programmed at the remaining levels (L5-L7). Similarly, in another example, in the updated QLC Gray code in FIG. 10B, after verifying at L11 (the 5th to last level), DC (storing XP) may be released since XPs at the remaining levels (L12-L15) are all "1," and D1, D2, and D3 (corresponding to "0") may be used to indicate memory cells 306 to be programmed at the remaining levels (L12-L15).

Method 1500 proceeds to operation 1504, as illustrated in FIG. 15, in which one of the N bits of the current data page is stored in one cache storage unit, and a respective one of the N bits of the current data page is stored in each of N−1 data storage units. For example, as shown in FIG. 7, control logic 512 may send control signals to the single cache storage unit 708 and the set of N−1 data storage units 706 of each page buffer circuit 702 to control the single cache storage unit 708 and N−1 data storage units 706 to store the N bits of the current data page, respectively. In other words, cache storage unit 708 may first act as a data storage unit as well, such that a total number of N data storage units (including cache storage unit 708) may store the N bits of the current data page, respectively.

For example, cache storage unit 708 may be configured to store the last bit of the N bits of the current data page before verifying select row of memory cells 306 at the (N+1)th to last level of the $2^N$ levels, and each data storage unit 706 may be configured to store the respective one of the N bits of the current data page before verifying select row of memory cells 306 at the Nth to last level of the $2^N$ levels. In some examples shown in FIGS. 11 and 12, according to some schemes of multi-cache data loading in a program operation applied to TLCs (N=3), before verifying select row of memory cells 306 at L4 (the 4th to last level, "L4 PASS" in FIGS. 11 and 12), cache storage unit 708 (DC) may store UP (the last bit) of the current data page; before verifying select row of memory cells 306 at L5 (the 3rd to last level, "L5 PASS" in FIGS. 11 and 12), 1st data storage unit 706 (D1) may store LP (the 1st bit) of the current data page, and 2nd data storage unit 706 (D2) may store MP (the 2nd bit) of the current data page. Similarly, in some examples shown in FIGS. 13A, 13B, 14A, and 14B, according to some schemes of multi-cache data loading in a program operation applied to QLCs (N=4), before verifying select row of memory cells 306 at L11 (the 5th to last level, "L11 PASS" shown in FIGS. 13A, 13B, 14A, and 14B), cache storage unit 708 (DC) may store XP (the last bit) of the current data page; before verifying select row of memory cells 306 at L12 (the 4th to last level, "L12 PASS" shown in FIGS. 13A, 13B, 14A, and 14B), 1st data storage unit 706 (D1) may store LP (the 1st bit) of the current data page, 2nd data storage unit 706 (D2) may store MP (the 2nd bit) of the current data page, and 3rd data storage unit 706 (D3) may store UP (the 3rd bit) of the current data page.

Method 1500 proceeds to operation 1506, as illustrated in FIG. 15, in which non-data page information is stored in a multipurpose storage unit. The non-data page information can include first information indicative of a voltage level applied to the respective bit line, or second information indicative of whether a respective memory cell of the select row is inhibited in programming. In one example, as shown in FIG. 7, control logic 512 may send control signals to the single 3BL/4BL storage unit 710 to control the single 3BL/4BL storage unit 710 to store bit line bias information (first information), e.g., one of the three or four voltage levels applied to the respective bit line 316. In another example, control logic 512 may send control signals to the single sensing/program storage unit 712 to control the single sensing/program storage unit 712 to store program inhibition information (second information), e.g., whether corresponding select memory cell 306 has passed the verification at a particular level (thus being inhibited in programming) or failed to pass the verification at the level (verify fail).

For example, 3BL/4BL storage unit 710 may be configured to store the non-data page information before verifying the 3rd to last level of the $2^N$ levels. In the example shown in FIG. 11, according to the scheme of multi-cache data loading applied to TLCs (N=3), before verifying select row of memory cells 306 at L5 (the 3rd to last level, "L5 PASS" in FIG. 11), 3BL/4BL storage unit 710 (DL) may store the bit line bias information ("3BL/4BL"). In the example shown in FIGS. 13A and 13B, according to the scheme of multi-cache data loading applied to QLCs (N=4), before verifying select row of memory cells 306 at L13 (the 3rd to last level, "L13 PASS" in FIG. 13B), 3BL/4BL storage unit 710 (DL) may store the bit line bias information ("3BL/4BL"). In the example shown in FIG. 12, according to the scheme of multi-cache data loading applied to TLCs (N=3), before verifying select row of memory cells 306 at L5 (the 3rd to last level, "L5 PASS" in FIG. 11), sensing/program storage unit 712 (DS) may store the program inhibition information ("inh"). In the example shown in FIGS. 14A and 14B, according to the scheme of multi-cache data loading applied to QLCs (N=4), before verifying select row of memory cells 306 at L13 (the 3rd to last level, "L13 PASS" in FIG. 13B), sensing/program storage unit 712 (DS) may store the program inhibition information ("inh").

Method 1500 proceeds to operation 1508, as illustrated in FIG. 15, in which a select row of the rows of memory cells is sequentially verified at $2^N-1$ levels of $2^N$ levels. For example, as shown in FIGS. 5 and 9B, control logic 512 may send control signals to row decoder/word line driver 508 to apply a program voltage (Vpgm) to a select word line 318 coupled to a select row of memory cells 306 and then send control signals to page buffer/sense amplifier 504 to sequentially apply $2^N-1$ verify voltages (Vvf) on select word line 318. The $2^N-1$ verify voltages can correspond to the $2^N-1$ levels of the $2^N$ levels. For example, for TLCs where N=3, the 7 verify voltages may respectively correspond to the 7 pieces of 3-bit data each corresponding to a respective level of the 7 programmed levels (L1 to L7) of the 8 levels; for QLCs where N=4, the 15 verify voltages may respectively correspond to the 15 pieces of 4-bit data each corresponding to a respective level of the 15 programmed levels (L1 to L15) of the 16 levels.

Method 1500 proceeds to operation 1510, as illustrated in FIG. 15, in which N bits of a next data page are obtained after verifying the selected row at the (N+1)th to last level of $2^N$ levels. For example, as shown in FIG. 7, during the current program operation, page buffer circuits 702 may start to cache the next data page for the next program operation by sequentially obtaining the N bits of the next data page at cache storage unit 708. As described above in detail, similar to the current data page, DPP units 714 of page buffer circuits 702 may receive the raw data for the next program operation and convert the raw data to the data of the next data page. The converted data of the next data page may then be received by cache storage units 708 of page buffer circuits 702 in sequence after verifying select row of memory cells 306 at the (N+1)th to last level (e.g., L4 for TLCs or L11 of QLCs).

Method 1500 proceeds to operation 1512, as illustrated in FIG. 15, in which each of the N bits of the next data page is sequentially stored in the cache storage unit after verifying the select row at a respective one of the last N+1 levels of the $2^N$ levels. For example, as shown in FIG. 7, control logic 512 may send control signals to cache storage unit 708 to sequentially storing each of the N bits of the next data page after verifying select row of memory cells 306 at a respective one of the last N+1 levels (e.g., L4-L7 for TLCs or L11-L15 for QLCs).

In some examples shown in FIGS. 11 and 12, according to the schemes of multi-cache data loading applied to TLCs (N=3), before verifying select row of memory cells 306 at L4 (the 4th to last level, "L4 PASS" in FIGS. 11 and 12), cache storage unit 708 (DC) may store UP (the last bit) of the current data page. After verifying at L4 (L4 PASS), since the Gray code may be updated ("L5 Re-DPP" in FIGS. 11 and 12) to change the values of L5 from "110" to "001", thereby releasing cache storage unit 708 from storing UP of the current data page, as described above in detail with respect to FIG. 10B. Thus, cache storage unit 708 may become free to cache the 3-bits of data of the next data page. Specifically, after verifying at L4 (L4 PASS), cache storage unit 708 may store LP (the 1st bit) of the next data page ("Next LP" during "Cache in LP" in FIGS. 11 and 12); after verifying at L5 (L5 PASS), cache storage unit 708 may store MP (the 2nd bit) of the next data page ("Next MP" during "Cache in MP" in FIGS. 11 and 12); after verifying at L6 (L6 PASS), cache storage unit 708 may store UP (the last bit) of the next data page ("Next UP" during "Cache in UP" in FIGS. 11 and 12).

In some examples shown in FIGS. 13A, 13B, 14A, and 14B, according to the schemes of multi-cache data loading applied to QLCs (N=4), before verifying select row of memory cells 306 at L11 (the 5th to last level, "L4 PASS" in FIGS. 13A and 14A), cache storage unit 708 (DC) may store XP (the last bit) of the current data page. After verifying at L11 (L11PASS), since the Gray code may be updated ("L12 Re-DPP" in FIGS. 13A and 14A) to change the values of L12 from "1110" to "0001", thereby releasing cache storage unit 708 from storing XP of the current data page, as described above in detail with respect to FIG. 10B. Thus, cache storage unit 708 may become free to cache the 4-bits of data of the next data page. Specifically, after verifying at L11 (L11 PASS), cache storage unit 708 may store LP (the 1st bit) of the next data page ("Next LP" during "Cache in LP" in FIGS. 13A and 14A); after verifying at L12 (L12 PASS), cache storage unit 708 may store MP (the 2nd bit) of the next data page ("Next MP" during "Cache in MP" in FIGS. 13A and 14A); after verifying at L13 (L13 PASS), cache storage unit 708 may store UP (the 3rd bit) of the next data page ("Next UP" during "Cache in UP" in FIGS. 13B and 14B); after verifying at L14 (L14 PASS), cache storage unit 708 may store XP (the last bit) of the next data page ("Next XP" during "Cache in XP" in FIGS. 13B and 14B).

Method 1500 proceeds to operation 1514, as illustrated in FIG. 15, in which at least one of the N bits of the current data page is stored in the multipurpose storage unit after verifying the select row at the 3rd to last level of the $2^N$ levels. In some implementations, the non-data page information includes first information indicative of a voltage level applied to a respective memory cell of the select row, and the 3rd to last bit of the N bits of the current data page is stored in the multipurpose storage unit after verifying the select row at the 3rd to last level of the $2^N$ levels. For example, as shown in FIG. 7, after verifying select row of memory cells 306 at the 3rd to last level (e.g., L5 for TLCs or L13 for QLCs), control logic 512 may send control signals to 3BL/4BL storage unit 710 to control 3BL/4BL storage unit 710 to store LP (the 3rd to last bit for TLCs) of the current data page or MP the 3rd to last bit for QLCs) of the current data page. In some implementations, the non-data page information includes second information indicative of whether a respective memory cell of the select row is inhibited in programming, and both the 2nd to last bit and the 3rd to last bit of the N bits of the current data page are stored in the multipurpose storage unit after verifying the select row at the 3rd to last level of the $2^N$ levels. For example, as shown in FIG. 7, after verifying select row of memory cells 306 at the 3rd to last level (e.g., L5 for TLCs or L13 for QLCs), control logic 512 may send control signals to sensing/program storage unit 712 to control sensing/program storage unit 712 to store LP and MP (the 3rd to last bit and the 2nd to last bit for TLCs) of the current data page or MP and UP (the 3rd to last bit and the 2nd to last bit for QLCs) of the current data page.

That is, either 3BL/4BL storage unit 710 or sensing/program storage unit 712 can be used to temporarily store some data of the current data page at certain times in the current program operation when the non-data page information may be skipped in order to enable all data (N bits) of the next data page be fully cached by data storage units 706 and cache storage unit 708 before the end of the current program operation. In the example shown in FIG. 11, according to the scheme of multi-cache data loading applied to TLCs (N=3), before verifying select row of memory cells 306 at L5 (the 3rd to last level, "L5 PASS" in FIG. 11), 3BL/4BL storage unit 710 (DL) may store the bit line bias information ("3BL/4BL"). After verifying at L5 (L5 PASS), LP of the current data page at L7 (corresponding to "0") may be copied ("L7→DL") from 1st data storage unit 706 (D1) to 3BL/4BL storage unit 710 (DL), such that 3BL/4BL storage unit 710 may store LP of the current data page at L7. It is understood that 3BL/4BL bias information may no longer be needed for verifying L7 (the last level) because the read margin and distribution width of the last level may be less critical compared with other levels. Thus, 3BL/4BL storage unit 710 (DL) may be free up to store LP of the current data page at L7. It is also understood that since LP of the current data page at L6 corresponds to "1," which indicates an inhibited status, it may not need to be copied to 3BL/4BL storage unit 710 (DL). Moreover, once LP of the current data page at L7 is copied to 3BL/4BL storage unit 710, 1st data storage unit 706 (D1) may be released since LPs at all the levels become "X" (the same as "1" to indicate an inhibited status as used in the present disclosure). As a result, 1st data storage unit 706 (D1) may be free to start caching LP of the next data page ("Next LP") that is moved from cache storage unit 708 (DC), thereby allowing cache storage unit 708 (DC) to cache MP of the next data page ("Cache in MP").

For example, as shown in TABLE II below, after verifying at L5, 3BL/4BL storage unit 710 (DL) may store 3L/4BL bias information at L6 and LP of the current data page at L7. At L6, the bit in 3BL/4BL storage unit 710 (DL) may be either "0" to indicate a full program bit line bias voltage ("full pgm") or may be "1" to indicate a 3L/4BL bit line bias voltage "3bl/4bl." As to the remaining 2nd data storage unit 706 (D2) that has not been released yet, 2nd data storage unit 706 (D2) may store MP of the current data page at L6 and become released at L7 (corresponding to "1" according to the Gray code). At L6, the bit in 2nd data storage unit 706 (D2) may be either "0" to indicate that corresponding select memory cell 306 has not passed the verification at L6 ("unpass L6") or may be "1" to indicate that corresponding select memory cell 306 has passed the verification at L6 to become inhibited ("inhib L6") in the current program operation.

TABLE II

|    | L0-L5 | L6                          | L7                            |
|----|-------|-----------------------------|-------------------------------|
| DL | X     | 0: full pgm<br>1: 3bl/4bl   | 0: unpass L7<br>1: inhib L7   |
| D2 | X     | 0: unpass L6<br>1: inhib L6 | 1                             |

It is understood that since LP of the current data page at L7 that is supposed to be stored in 1st data storage unit 706 (D1) has been moved to 3BL/4BL storage unit 710 (DL) before verifying at L7, when verifying at L7, any internal operations of page buffer circuits 702 directed to 1st data storage unit 706 (D1) may be redirected to 3BL/4BL storage unit 710 (DL). It is also understood that when verifying at L7, although corresponding memory cell 306 that is to be programmed using the full program bit line bias voltage at L6 ("0" of DL at L6) may be included as well due to the same value of "0" used for both "full pgm" and "unpass L7," the verification result at L7 may not be impacted since the threshold voltage of memory cell 306 at L6 is lower than that at L7. It is further understood that in some examples, the inhibition information "inbit L7" may be cleaned up to keep 3BL/4BL storage unit 710 (DL) when applying the program voltage (pulse), which may not matter in the destructive mode that updates the inhibition information every time.

Figure 13A:
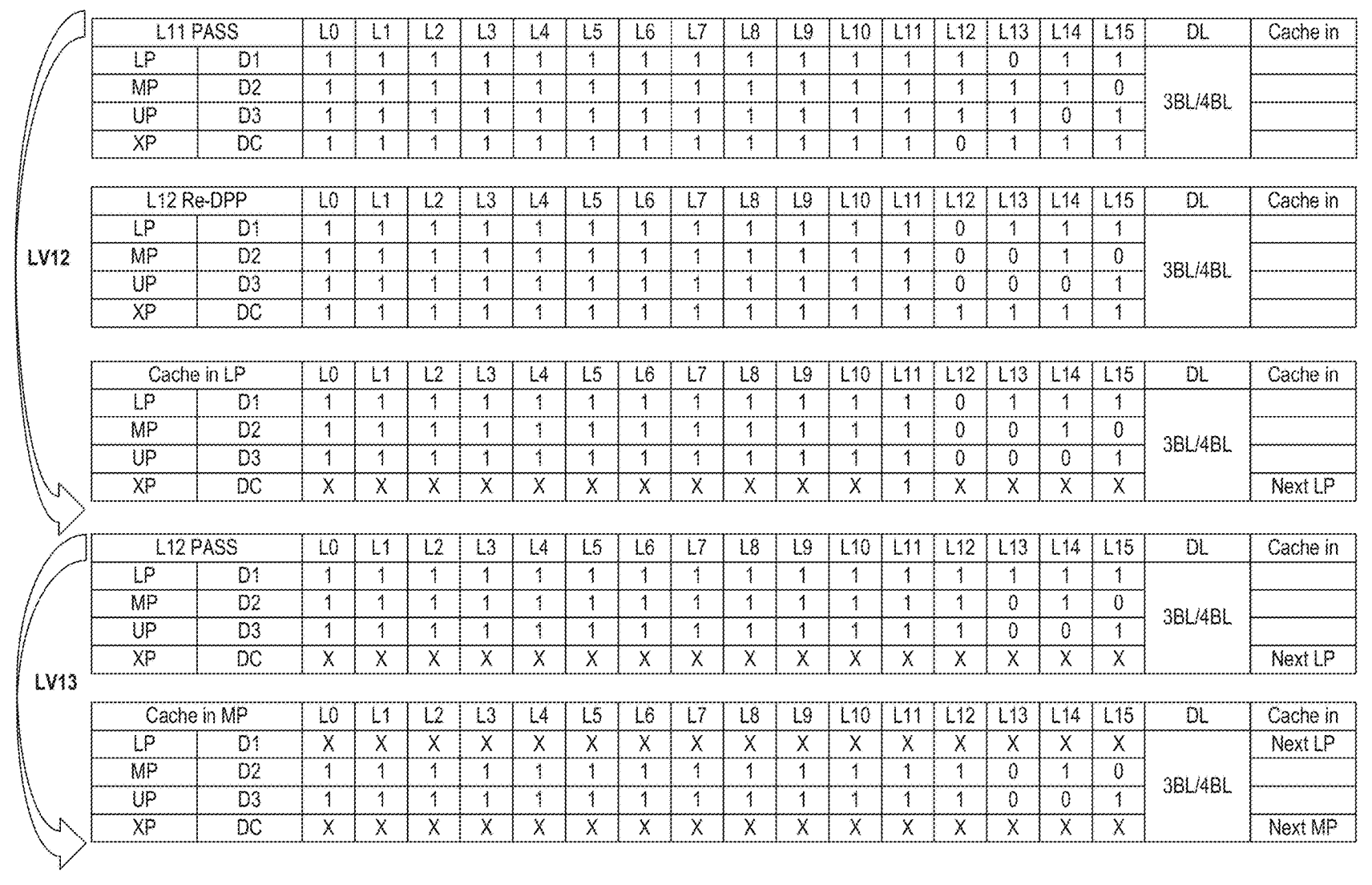
Figure 13B:
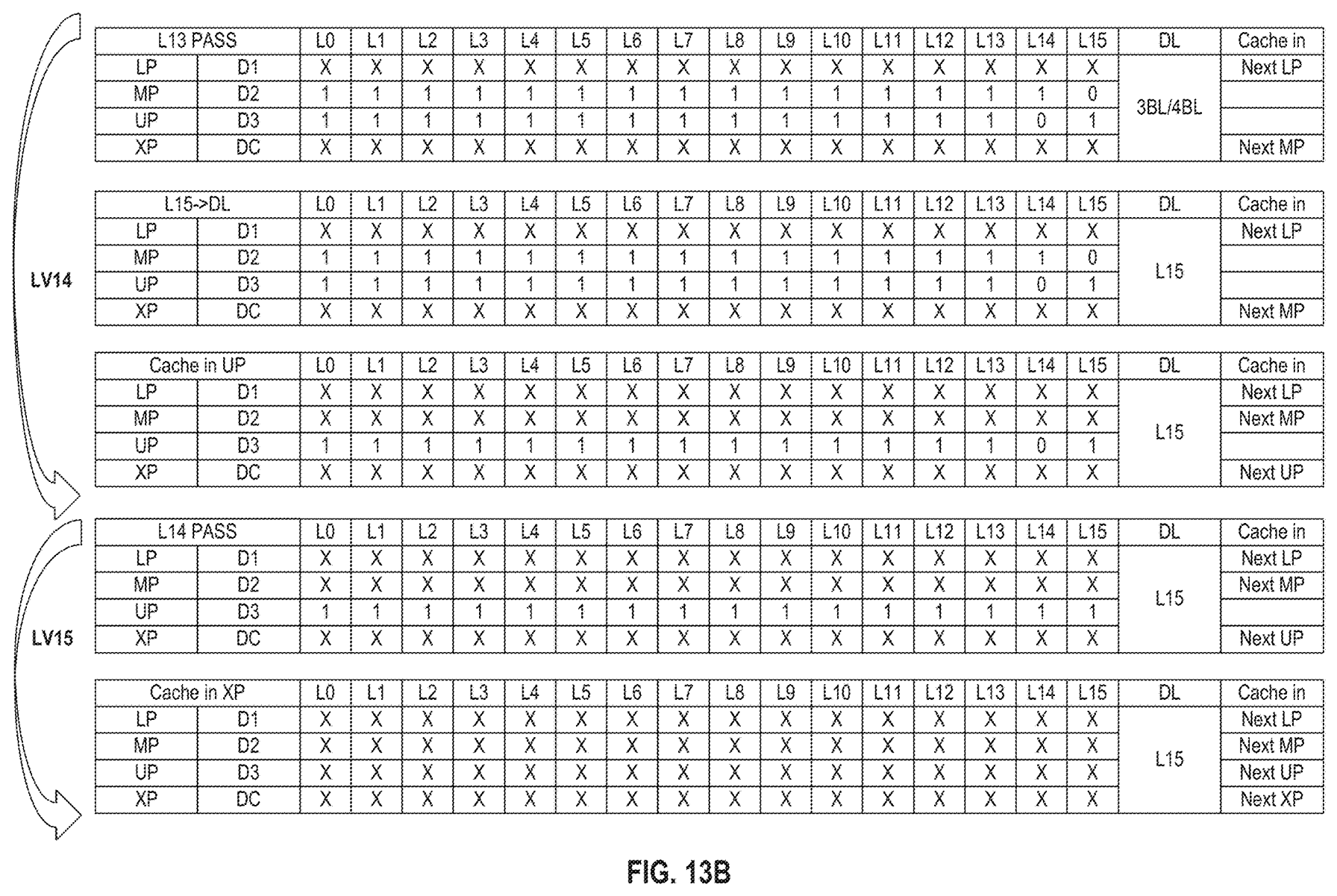

Similarly, in the example shown in FIGS. 13A and 13B, according to the scheme of multi-cache data loading applied to QLCs (N=4), before verifying select row of memory cells 306 at L13 (the 3rd to last level, "L13 PASS" in FIG. 13B), 3BL/4BL storage unit 710 (DL) may store the bit line bias information ("3BL/4BL"). After verifying at L13 (L13 PASS), MP of the current data page at L15 (corresponding to "0") may be copied ("L15→DL") from 2nd data storage unit 706 (D2) to 3BL/4BL storage unit 710 (DL), such that 3BL/4BL storage unit 710 may store MP of the current data page at L15. It is understood that 3BL/4BL bias information may no longer be needed for verifying L15 (the last level) because the read margin and distribution width of the last level may be less critical compared with other levels. Thus, 3BL/4BL storage unit 710 (DL) may be free up to store MP of the current data page at L15. It is also understood that since MP of the current data page at L14 corresponds to "1," which indicates an inhibited status, it may not need to be copied to 3BL/4BL storage unit 710 (DL). Moreover, once MP of the current data page at L15 is copied to 3BL/4BL storage unit 710, 2nd data storage unit 706 (D2) may be released since MPs at all the levels become "X" (the same as "1" to indicate an inhibited status as used in the present disclosure). As a result, 2nd data storage unit 706 (D2) may be free to start caching MP of the next data page ("Next MP") that is moved from cache storage unit 708 (DC), thereby allowing cache storage unit 708 (DC) to cache UP of the next data page ("Cache in UP").

For example, as shown in TABLE III below, after verifying at L14, 3BL/4BL storage unit 710 (DL) may store 3L/4BL bias information at L14 and MP of the current data page at L15. At L14, the bit in 3BL/4BL storage unit 710 (DL) may be either "0" to indicate a full program bit line bias voltage ("full pgm") or may be "1" to indicate a 3L/4BL bit line bias voltage "3bl/4bl." As to the remaining 3rd data storage unit 706 (D3) that has not been released yet, 3rd data storage unit 706 (D3) may store UP of the current data page at L14 and become released at L15 (corresponding to "1" according to the Gray code). At L15, the bit in 3rd data storage unit 706 (D3) may be either "0" to indicate that corresponding select memory cell 306 has not passed the verification at L14 ("unpass L14") or may be "1" to indicate that corresponding select memory cell 306 has passed the verification at L14 to become inhibited ("inhib L14") in the current program operation.

TABLE III

| | L0-L13 | L14 | L15 |
|---|---|---|---|
| DL | X | 0: full pgm<br>1: 3bl/4bl | 0: unpass L15<br>1: inhib L15 |
| D3 | X | 0: unpass L14<br>1: inhib L14 | 1 |

It is understood that since MP of the current data page at L15 that is supposed to be stored in 2nd data storage unit 706 (D2) has been moved to 3BL/4BL storage unit 710 (DL) before verifying at L15, when verifying at L15, any internal operations of page buffer circuits 702 directed to 2nd data storage unit 706 (D2) may be redirected to 3BL/4BL storage unit 710 (DL). It is also understood that when verifying at L15, although corresponding memory cell 306 that is to be programmed using the full program bit line bias voltage at L14 ("0" of DL at L14) may be included as well due to the same value of "0" used for both "full pgm" and "unpass L15," the verification result at L15 may not be impacted since the threshold voltage of memory cell 306 at L14 is lower than that at L15. It is further understood that in some examples, the inhibition information "inbit L15" may be cleaned up to keep 3BL/4BL storage unit 710 (DL) when applying the program voltage (pulse), which may not matter in the destructive mode that updates the inhibition information every time.

In the example shown in FIG. 12, according to the scheme of multi-cache data loading applied to TLCs (N=3), before verifying select row of memory cells 306 at L5 (the 3rd to last level, "L5 PASS" in FIG. 11), sensing/program storage unit 712 (DS) may store the cell inhibition information ("inh"). After verifying at L5 (L5 PASS), LP and MP of the current data page at L6 and L7 may be copied from 1st data storage unit 706 (D1) and 2nd data storage unit 706 (D2) to sensing/program storage unit 712 (DS), such that sensing/program storage unit 712 may store LP and MP of the current data page at L6 and L7. In some examples, sensing/program storage unit 712 may record all unpassed memory cells 306 ("0") at L6 and L7 based on LP and MP of the current data page at L6 and L7. It is understood that although all unpassed memory cells 306 ("0") at L6 and L7 may have to be verified at the same time, MP of the current data page may be used to separate memory cells at L6 and memory cells at L7 when updating the verification result based on the different values of the MP of the current page, e.g., L6 when MP is "0" or L7 when MP is "1." Thus, sensing/program storage unit 712 (DS) may be free up to store LP of the current data page at L7. Moreover, once LP of the current data page at L7 is copied to sensing/program storage unit 712, 1st data storage unit 706 (D1) may be released since LPs at all the levels become "X" (the same as "1" to indicate an inhibited status as used in the present disclosure). As a result, 1st data storage unit 706 (D1) may be free to start caching LP of the next data page ("Next LP") that is moved from cache storage unit 708 (DC), thereby allowing cache storage unit 708 (DC) to cache MP of the next data page ("Cache in MP").

For example, as shown in TABLE IV below, after verifying at L5, sensing/program storage unit 712 (DS) may store LP and MP of the current data page at L6 and L7 (e.g., the unpassed cells "0" at L6 and L7). As to the remaining 2nd data storage unit 706 (D2) that has not been released yet, 2nd data storage unit 706 (D2) may store MP of the current data page at L6 and become released at L7 (corresponding to "1" according to the Gray code). At L6, the bit in 2nd data storage unit 706 (D2) may be either "0" to indicate that corresponding select memory cell 306 has not passed the verification at L6 ("unpass L6") or may be "1" to indicate that corresponding select memory cell 306 has passed the verification at L6 to become inhibited ("inhib L6") in the current program operation. When verifying at L6, MP of the current data page stored in 2nd data storage unit 706 (D2) may be used to separate memory cells at L6 and memory cells at L7 when updating the verification result, depending on the value of the MP, e.g., L6 when D2 is "0" or L7 when D2 is "1."

TABLE IV

| | L0-L5 | L6 | L7 |
|---|---|---|---|
| DS | X | 0: unpass L6<br>1: inhib L6 | 0: unpass L7<br>1: inhib L7 |
| D2 | X | 0: unpass L6<br>1: inhib L6 | 1 |

It is understood that in some examples, the data stored in sensing/program storage unit 712 (DS) may need to be kept when applying the program voltage (pulse), and the inhibited bit line 316 may need to be floated when switching data between sensing/program storage unit 712 (DS) and 3BL/4BL storage unit 710 (DL).

In the example shown in FIGS. 14A and 14B, according to the scheme of multi-cache data loading applied to QLCs (N=4), before verifying select row of memory cells 306 at L13 (the 3rd to last level, "L13 PASS" in FIG. 14B), sensing/program storage unit 712 (DS) may store the cell inhibition information ("inh"). After verifying at L13 (L13 PASS), MP and UP of the current data page at L14 and L15 may be copied from 2nd data storage unit 706 (D2) and 3rd data storage unit 706 (D3) to sensing/program storage unit 712 (DS), such that sensing/program storage unit 712 may store MP and UP of the current data page at L14 and L15. In some examples, sensing/program storage unit 712 may record all unpassed memory cells 306 ("0") at L14 and L15 based on MP and UP of the current data page at L14 and L15. It is understood that although all unpassed memory cells 306 ("0") at L14 and L15 may have to be verified at the same time, UP of the current data page may be used to separate memory cells at L14 and memory cells at L15 when updating the verification result based on the different values of the UP of the current page, e.g., L14 when UP is "0" or L15 when UP is "1." Thus, sensing/program storage unit 712 (DS) may be free up to store MP of the current data page at L15. Moreover, once MP of the current data page at L15 is copied to sensing/program storage unit 712, 2nd data storage unit 706 (D2) may be released since MPs at all the levels become "X" (the same as "1" to indicate an inhibited status as used in the present disclosure). As a result, 2nd data storage unit 706 (D2) may be free to start caching MP of the next data page ("Next MP") that is moved from cache storage unit 708 (DC), thereby allowing cache storage unit 708 (DC) to cache UP of the next data page ("Cache in UP").

For example, as shown in TABLE V below, after verifying at L13, sensing/program storage unit 712 (DS) may store MP and UP of the current data page at L14 and L15 (e.g., the unpassed cells "0" at L14 and L15). As to the remaining 3rd data storage unit 706 (D3) that has not been released yet, 3rd data storage unit 706 (D3) may store UP of the current data page at L14 and become released at L15 (corresponding to "1" according to the Gray code). At L14, the bit in 3rd data storage unit 706 (D3) may be either "0" to indicate that corresponding select memory cell 306 has not passed the verification at L14 ("unpass L14") or may be "1" to indicate that corresponding select memory cell 306 has passed the verification at L14 to become inhibited ("inhib L14") in the current program operation. When verifying at L14, UP of the current data page stored in 3rd data storage unit 706 (D3) may be used to separate memory cells at L14 and memory cells at L15 when updating the verification result, depending on the value of the MP, e.g., L14 when D3 is "0" or L15 when D3 is "1."

TABLE V

|    | L0–L13 | L14                        | L15                        |
|----|--------|----------------------------|----------------------------|
| DS | X      | 0: unpass L14 1: inhib L14 | 0: unpass L15 1: inhib L15 |
| D3 | X      | 0: unpass L14 1: inhib L14 | 1                          |

It is understood that in some examples, the data stored in sensing/program storage unit 712 (DS) may need to be kept when applying the program voltage (pulse), and the inhibited bit line 316 may need to be floated when switching data between sensing/program storage unit 712 (DS) and 3BL/4BL storage unit 710 (DL).

Method 1500 proceeds to operation 1516, as illustrated in FIG. 15, in which each of the first bit to 2nd to last bit of the N bits of the next data page is sequentially stored in the respective data storage unit after verifying the select row at a respective one of the last N levels of the $2^N$ levels. As described above, by allowing a multipurpose storage unit to temporality store at least one of the N bits of the current data page, each data storage unit can be free up to cache a respective bit of the N bits of the next data page.

In one example, the (N−1)th data storage unit (2nd data storage unit 706 (D2) for TLCs or 3rd data storage unit 706 (D3) for QLCs) may be configured to store the 2nd to last bit of the N bits (MP for TLCs or UP for QLCs) of the current data page before verifying select row of memory cells 306 at the 2nd to last level (L6 for TLCs or L14 for QLCs), and store the 2nd to last bit of the N bits (MP for TLCs or UP for QLCs) of the next data page after verifying select row of memory cells 306 at the 2nd to last level (L6 for TLCs or L14 for QLCs). In another example, the (N−2)th data storage unit (1st data storage unit 706 (D1) for TLCs or 2nd data storage unit 706 (D2) for QLCs) may be configured to store the 3rd to last bit of the N bits (LP for TLCs or MP for QLCs) of the current data page before verifying select row of memory cells 306 at the 3rd to last level (L5 for TLCs or L13 for QLCs), and store the 3rd to last bit of the N bits (LP for TLCs or MP for QLCs) of the next data page after verifying select row of memory cells 306 at the 3rd to last level (L5 for TLCs or L13 for QLCs). In still another example, the (N−3)th data storage unit (1st data storage unit 706 (D1) for QLCs) may be configured to store the 4th to last bit of the N bits (LP for QLCs) of the current data page before verifying select row of memory cells 306 at the 4th to last level (L12 for QLCs), and store the 4th to last bit of the N bits (LP for QLCs) of the next data page after verifying select row of memory cells 306 at the 4th to last level (L12 for QLCs). For example, as shown in FIGS. 11 and 12, D1 may start to cache next LP after verifying at L5, and D2 may start to cache next MP after verifying at L6; as shown in FIGS. 13A, 13B, 14A, and 14B, D1 may start to cache next LP after verifying at L12, D2 may start to cache next MP after verifying at L13, and D3 may start to cache next UP after verifying at L14.

Method 1500 proceeds to operation 1518, as illustrated in FIG. 15, in which a next select row of the rows of memory cells is programmed based on the next data page. As shown in FIGS. 11 and 12, for TLCs (N=3), since all 3 bits of the next data page (next LP, next MP, and next UP) may be cached after verifying at L6 (L6 PASS), the next data page may become ready during the current program operation. Similarly, as shown in FIGS. 13B and 14B, for QLCs (N=4), since all 4 bits of the next data page (next LP, next MP, next UP, and next XP) may be cached after verifying at L14 (L4 PASS), the next data page may become ready during the current program operation. Thus, at the end of the current program operation, the next program operation based on the next data page may be seamlessly triggered without a data loading window.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, and rearranged with one another and in ways that are consistent with the scope of the present disclosure.

What is claimed is:

1. A memory device, comprising:
   an array of memory cells in columns and rows, each memory cell being set to one of $2^N$ levels corresponding to a piece of N-bits data, where N is an integer greater than 2;
   word lines respectively coupled to rows of the memory cells;
   bit lines respectively coupled to the columns of the memory cells; and
   a peripheral circuit coupled to the array of memory cells through the bit lines and the word lines and configured to program a select row of the rows of the memory cells based on a current data page, the peripheral circuit comprising page buffer circuits respectively coupled to the bit lines, each page buffer circuit comprising:
     one cache storage unit configured to, in programming the select row based on the current data page, sequentially receive N bits of the current data page and N bits of a next data page, and sequentially store one of the N bits of the current data page and each of the N bits of the next data page;
     N−1 data storage units each configured to, in programming the select row based on the current data page, sequentially store a respective one of the N bits of the current data page and a respective one of the N bits of the next data page; and
     a multipurpose storage unit configured to, in programming the select row based on the current data page, store at least one of the N bits of the current data page.

2. The memory device of claim 1, wherein the multipurpose storage unit is configured to, in programming the select row based on the current data page, sequentially store first information indicative of a voltage level applied to the respective bit line, and the 3rd to last bit of the N bits of the current data page.

3. The memory device of claim 1, wherein the multipurpose storage unit is configured to, in programming the select row based on the current data page, sequentially store second information indicative of whether a respective memory cell of the select row is inhibited in programming, and the 2nd to last bit and the 3rd to last bit of the N bits of the current data page.

4. The memory device of claim 1, wherein the page buffer circuit further comprises a data pre-processing unit coupled to the cache storage unit and configured to convert N bits of a raw data page to the N bits of the current data page based on a Gray code, a first number of bits corresponding to "0" at one level in the Gray code being not smaller than a second number of bits corresponding to "0" at an adjacent higher level in the Gray code.

5. The memory device of claim 4, wherein at the 2nd to last level of the $2^N$ levels in the Gray code, only the 2nd to last bit of the N bits corresponds to "0".

6. The memory device of claim 1, wherein to program the select row based on the current data page, the peripheral circuit is configured to sequentially verify the select row at $2^N-1$ levels of the $2^N$ levels.

7. The memory device of claim 6, wherein the cache storage unit is configured to:
store the last bit of the N bits of the current data page before verifying the select row at the (N+1)th to last level of the $2^N$ levels; and
sequentially store each of the N bits of the next data page after verifying the select row at a respective one of the last N+1 levels to of the $2^N$ levels.

8. The memory device of claim 6, wherein the multipurpose storage unit is configured to:
store non-data page information before verifying the select row at the 3rd to last level of the $2^N$ levels; and
store the at least one of the N bits of the current data page after verifying the select row at the 3rd to last level of the $2^N$ levels.

9. The memory device of claim 6, wherein the (N−1)th data storage unit of the data storage units is configured to:
store the 2nd to last bit the N bits of the current data page before verifying the select row at the 2nd to last level of the $2^N$ levels; and
store the 2nd to last bit of the N bits of the next data page after verifying the select row at the 2nd to last level of the $2^N$ levels.

10. The memory device of claim 6, wherein the peripheral circuit further comprises a word line driver coupled to the word lines and configured to:
apply a program voltage on a select word line of the word lines coupled to the select row; and
sequentially apply $2^N-1$ verify voltages on the select word line, the $2^N-1$ verify voltages corresponding to the $2^N-1$ levels of the $2^N$ levels.

11. The memory device of claim 1, wherein the peripheral circuit is further configured to program a next select row of the rows of memory cells based on the next data page after programming the select row based on the current data page.

12. A system, comprising:
a memory device configured to store data, the memory device comprising:
an array of memory cells in columns and rows, each memory cell being set to one of $2^N$ levels corresponding to a piece of N-bits data, where N is an integer greater than 2;
word lines respectively coupled to rows of the memory cells;
bit lines respectively coupled to the columns of the memory cells; and
a peripheral circuit coupled to the array of memory cells through the bit lines and the word lines and configured to program a select row of the rows of the memory cells based on a current data page, the peripheral circuit comprising page buffer circuits respectively coupled to the bit lines, each page buffer circuit comprising:
one cache storage unit configured to, in programming the select row based on the current data page, sequentially receive N bits of the current data page and N bits of a next data page, and sequentially store one of the N bits of the current data page and each of the N bits of the next data page;
N−1 data storage units each configured to, in programming the select row based on the current data page, sequentially store a respective one of the N bits of the current data page and a respective one of the N bits of the next data page; and
at least one multipurpose storage unit configured to, in programming the select row based on the current data page, store at least one of the N bits of the current data page; and
a memory controller coupled to the memory device and configured to control the memory device.

13. A method for programming a memory device comprising rows of memory cells, the method comprising:
obtaining N bits of a current data page, where N is an integer greater than 2;
storing one of the N bits of the current data page in one cache storage unit and a respective one of the N bits of the current data page in each of N−1 data storage units;
storing non-data page information in a multipurpose storage unit;
sequentially verifying a select row of the rows of memory cells at $2^N-1$ levels of $2^N$ levels;
storing at least one of the N bits of the current data page in the multipurpose storage unit after verifying the select row at the 3rd to last level of the $2^N$ levels;
obtaining N bits of a next data page after verifying the select row at the (N+1)th to last level of $2^N$ levels; and
sequentially storing each of the N bits of the next data page in the cache storage unit after verifying the select row at a respective one of the last N+1 levels of the $2^N$ levels.

14. The method of claim 13, wherein obtaining the N bits of the current data page comprises:
receiving N bits of a raw data page; and
converting the N bits of the raw data page to the N bits of the current data page based on a Gray code, wherein a first number of bits corresponding to "0" at one level in the Gray code is not smaller than a second number of bits corresponding to "0" at an adjacent higher level in the Gray code.

15. The method of claim 14, wherein at the 2nd to last level of the $2^N$ levels in the Gray code, only the 2nd to last bit of the N bits corresponds to "0".

16. The method of claim 14, further comprising updating the Gray code after verifying the select row at the (N+1)th to last level of $2^N$ levels such that, at the Nth to last level of the $2^N$ levels in the Gray code, only the last bit of the N bits corresponds to "1".

17. The method of claim 13, further comprising sequentially storing each of the first bit to 2nd to last bit of the N bits of the next data page in the respective data storage unit after verifying the select row at a respective one of the last N levels of the $2^N$ levels.

18. The method of claim 13, wherein
the non-data page information comprises first information indicative of a voltage level applied to a respective memory cell of the select row; and
storing the at least one of the N bits of the current data page in the multipurpose storage unit comprises storing the 3rd to last bit of the N bits of the current data page in the multipurpose storage unit after verifying the select row at the 3rd to last level of the $2^N$ levels.

19. The method of claim 13, wherein
the non-data page information comprises second information indicative of whether a respective memory cell of the select row is inhibited in programming; and
storing the at least one of the N bits of the current data page in the multipurpose storage unit comprises storing the 2nd to last bit and the 3rd to last bit of the N bits of the current data page in the multipurpose storage unit after verifying the select row at the 3rd to last level of the $2^N$ levels.

20. The method of claim 13, wherein storing one of the N bits of the current data page in the one cache storage unit comprises storing the last bit of the N bits of the current data page in the cache storage unit before verifying the select row at the (N+1)th to last level of the $2^N$ levels.

* * * * *